(12) United States Patent
Shimotani et al.

(10) Patent No.: US 8,344,244 B2
(45) Date of Patent: Jan. 1, 2013

(54) SOLAR CELL USING CARBON NANOTUBES AND PROCESS FOR PRODUCING THE SAME

(75) Inventors: Kei Shimotani, Kanagawa (JP); Chikara Manabe, Kanagawa (JP); Takashi Morikawa, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 124 days.

(21) Appl. No.: 13/046,289

(22) Filed: Mar. 11, 2011

(65) Prior Publication Data

US 2011/0162695 A1    Jul. 7, 2011

Related U.S. Application Data

(62) Division of application No. 11/191,058, filed on Jul. 28, 2005, now Pat. No. 7,928,318.

(30) Foreign Application Priority Data

Feb. 24, 2005  (JP) .................................. 2005-048551

(51) Int. Cl.
    *H01L 31/00* (2006.01)
(52) U.S. Cl. ........ 136/256; 136/255; 136/252; 257/458; 257/459; 257/443; 257/446; 257/448
(58) Field of Classification Search .................. 136/256, 136/255, 252; 257/458, 459, 443, 446, 448
    See application file for complete search history.

(56) References Cited

U.S. PATENT DOCUMENTS

| 3,489,615 | A | 1/1970 | Mann et al. |
| 6,426,134 | B1 | 7/2002 | Lavin et al. |
| 6,649,824 | B1 * | 11/2003 | Den et al. ....................... 136/256 |
| 6,724,064 | B2 * | 4/2004 | Watanabe et al. .............. 257/459 |
| 2002/0024099 | A1 | 2/2002 | Watanabe et al. |
| 2003/0122133 | A1 | 7/2003 | Choi et al. |
| 2004/0041154 | A1 * | 3/2004 | Watanabe et al. ............... 257/77 |
| 2004/0109666 | A1 | 6/2004 | Kim, II |
| 2005/0121068 | A1 | 6/2005 | Sager et al. |
| 2006/0041050 | A1 | 2/2006 | Manane et al. |

FOREIGN PATENT DOCUMENTS

| JP | A-2002-503204 | 1/2002 |
| JP | A-2003-209270 | 7/2003 |
| JP | A-2004-142972 | 5/2004 |
| JP | A-2004-179564 | 6/2004 |
| WO | WO-2004/058899 A | 7/2004 |

OTHER PUBLICATIONS

Mar. 30, 2010 Notification of Reasons for Refusal issued in Japanese Application No. 2005-048551.

Kymakis et al., "High open-circuit voltage photovoltaic devices from carbon-nanotube-polymer composites," Journal of Applied Physics, vol. 93, No. 3, Feb. 1, 2003, pp. 1764-1768.

* cited by examiner

*Primary Examiner* — Jonathan Johnson
*Assistant Examiner* — Golam Mowla
(74) *Attorney, Agent, or Firm* — Oliff & Berridge, PLC

(57) ABSTRACT

A solar cell includes a p-type semiconductor substance, and an n-type semiconductor substance. The p-type semiconductor substance and the n-type semiconductor substance form a pn junction or a pin junction, and the p-type semiconductor substance or the n-type semiconductor substance includes a structure film having a plurality of carbon nanotubes electrically connected to each other.

2 Claims, 6 Drawing Sheets

SOLAR CELL USING CARBON NANOTUBES AND PROCESS FOR PRODUCING THE SAME

This is a Division of application Ser. No. 11/191,058 filed Jul. 28, 2005, which claims priority of Japanese Application No, 2005-048551 filed Feb. 24, 2005. The disclosure of the prior application is hereby incorporated by reference herein in its entirety.

BACKGROUND

1. Field of the Invention

The present invention relates to a solar cell, and more particularly, it relates to a solar cell utilizing an internal electric field formed with a pn junction or a pin junction, and a process for producing the same.

2. Description of the Related Art

Studies for utilizing the solar energy as environmentally thoughtful energy have been earnestly made. In particular, such a solid state device has been earnestly studied that converts the solar energy directly to electric energy using an inorganic semiconductor, owing to the high photoelectric conversion efficiency thereof, and solar cells utilizing single crystal, polycrystalline or amorphous silicon have been put into practical use. The solar cell utilizing an inorganic semiconductor attains a photoelectric conversion efficiency (energy conversion efficiency, i.e., a ratio of generated electric energy to incident light energy) reaching, for example, about 15% in the case using silicon.

The semiconductor layer, which is an important constitutional element of the solar cell, has a semiconductor junction, such as a pn junction (i.e., a p-type semiconductor substance and an n-type semiconductor substance are directly joined to each other) and a pin junction (i.e., a p-type semiconductor substance and an n-type semiconductor substance are joined with an intermediate layer intervening therebetween). The semiconductor junction is formed by sequentially accumulating semiconductor layers having different conductivity types, or doping a semiconductor layer by injecting a dopant having a conductivity type different from the semiconductor layer into the semiconductor layer by the ion injection method, or by diffusing the dopant into the semiconductor layer by the thermal diffusion method.

However, the production process of the solar cell using an inorganic thin film semiconductor requires a special equipment to raise the production cost of the solar cell, and furthermore, the process uses toxic raw material gases. Therefore, the process cannot be environmentally thoughtful.

In a solar cell using an organic semiconductor, on the other hand, various studies for practical application have been made owing to the excellent characteristics, i.e., an organic semiconductor has wide variety and low toxicity and is good in workability to enable reduction in cost with mass production. However, a solar cell using an organic semiconductor has not yet been put into practical application because of the low photoelectric conversion efficiency thereof. The reason why the solar cell using an organic semiconductor has a low photoelectric conversion efficiency includes the low photocarrier forming capability of the organic semiconductor, the narrow photocarrier forming region around the junction as compared to an inorganic semiconductor, and the low capability of transporting the carriers thus formed. As a result, only a small electric current is formed to provide low photoelectric conversion efficiency.

In recent years, carbon nanotubes, which have an extremely minute size and peculiar characteristics in semiconductor or conductor property and other electric and physical properties, have been studied as raw materials for various purposes. Various electric and electronic devices, such as a transistor, using carbon nanotubes have been developed. However, these electric or electronic devices use carbon nanotubes for miniaturizing them as disclosed in JP-A-2004-179564, or for improving the eleetroconductivity of the devices as disclosed in J. App. Phys., vol. 93, p. 1764 (2003). Accordingly, they not only contains no application to a solar cell, which requires a certain area for receiving light, but also contains no concept of the application to a solar cell.

SUMMARY

The invention is to provide such a solar cell of a pn junction type or a pin junction type that is easily produced and has a high photoelectric conversion efficiency by using an organic semiconductor containing carbon nanotubes, and to provide a process for producing the same.

According to an aspect of the present invention, a solar cell includes a p-type semiconductor substance, and an n-type semiconductor substance. The p-type semiconductor substance and the n-type semiconductor substance form a pn junction or a pin junction, and the p-type semiconductor substance or the n-type semiconductor substance includes a structure film having a plurality of carbon nanotubes electrically connected to each other.

According to another aspect of the present invention, in the case where the carbon nanotube structure film is employed as a p-type semiconductor substance, a method for producing a solar cell includes feeding a solution including a plurality of carbon nanotubes each having a functional group bonded thereto, to a surface of a layer including an n-type semiconductor substance, and crosslinking the carbon nanotubes to each other through chemical bonds with the plurality of functional groups to form a carbon nanotube structure having a network structure including the plurality of carbon nanotubes crosslinked to each other.

According to another aspect of the present invention, in the case where the carbon nanotube structure film is employed as an n-type semiconductor substance, a method for producing a solar cell includes dropping a mixed liquid including carbon nanotubes onto a liquid surface of a film forming liquid to spread the carbon nanotubes on the liquid surface of the film forming liquid, so as to form a carbon nanotube thin film, and drawing up a layer including a p-type semiconductor substance, a part or whole of which has been immersed in advance in the film forming liquid, from the liquid surface of the film forming liquid to make a surface of the layer including the p-type semiconductor substance in contact with the carbon nanotube thin film spread on the liquid surface of the film forming liquid, so as to form the carbon nanotube thin film on the surface of the layer including the p-type semiconductor substrate.

BRIEF DESCRIPTION OF THE DRAWINGS

Embodiments of the present invention will be described in detail based on the following figures, wherein.

DETAILED DESCRIPTION OF EMBODIMENTS

The solar cell and the process for producing the same of the invention will be described in detail below.
Solar Cell The solar cell of the invention contains a p-type semiconductor substance and an n-type semiconductor substance, which form a pn junction or a pin junction, and the p-type semiconductor substance or the n-type semiconductor substance contains a structure film containing plural carbon nanotubes electrically connected to each other.

Figure 1:
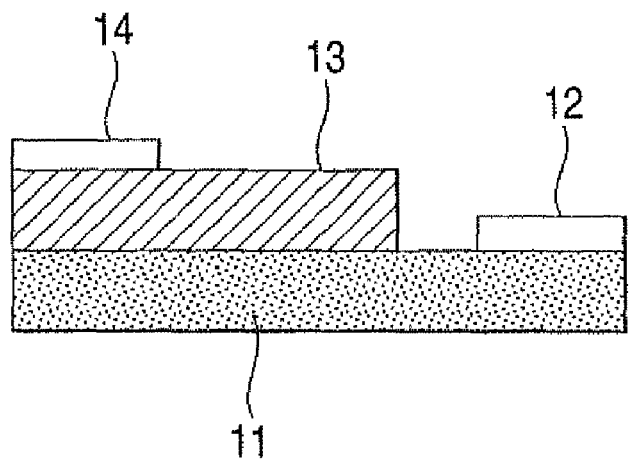
FIG. 1 is a schematic cross sectional view showing an embodiment of the solar cell of the invention, in which a carbon nanotube structure film is employed as a p-type semiconductor substance, and forms a pn junction with an n-type semiconductor substance.

The constitution of the carbon nanotube structure film varies depending on whether the carbon nanotube structure film is employed as a p-type semiconductor substance or an n-type semiconductor substance. FIG. 1 is a schematic cross sectional view showing an embodiment of the solar cell of the invention, in which the carbon nanotube structure film is employed as a p-type semiconductor substance, and forms a pn junction with an n-type semiconductor substance.

The solar cell of the embodiment contains an n-type semiconductor layer 11 containing an n-type semiconductor substance. A p-type semiconductor layer 13 containing a carbon nanotube structure film, which is a p-type semiconductor substance, is formed on the whole surface of the n-type semiconductor layer 11 except for an end surface thereof. An electrode 14 is accumulated on the p-type semiconductor layer 13, and an electrode 12 is formed on the end surface of the n-type semiconductor layer 11.

Figure 2:
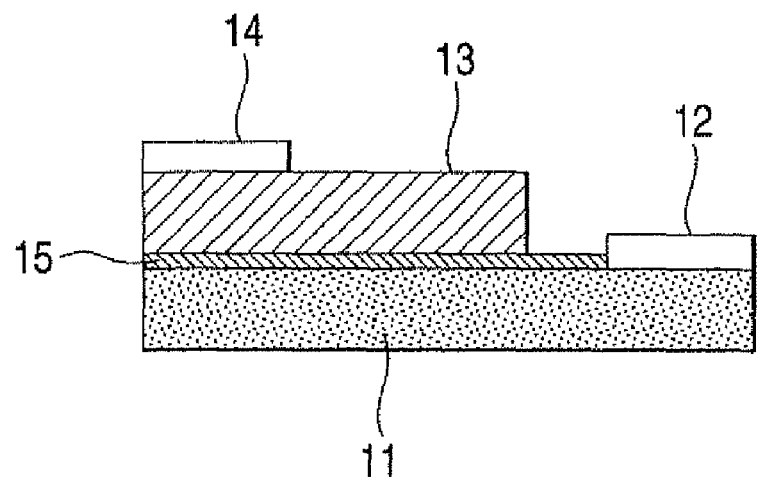
FIG. 2 is a schematic cross sectional view showing an embodiment of the solar cell of the invention, in which a carbon nanotube structure film is employed as a p-type semiconductor substance, and forms a pin junction with an n-type semiconductor substance.

FIG. 2 is a schematic cross sectional view showing an embodiment of the solar cell of the invention, in which the carbon nanotube structure film is employed as a p-type semiconductor substance, and forms a pin junction with an n-type semiconductor substance.

The solar cell of this embodiment has the same constitution as the solar cell shown in FIG. 1, and the same symbols are attached to the corresponding members, except that an intermediate layer (i layer) 15 intervenes between the n-type semiconductor layer 11 and the p-type semiconductor layer 13 to form a pin junction.

Figure 3:
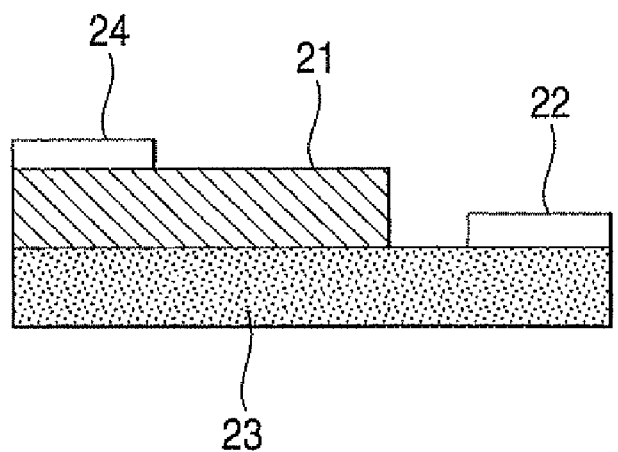
FIG. 3 is a schematic cross sectional view showing an embodiment of the solar cell of the invention, in which a carbon nanotube structure film is employed as an n-type semiconductor substance, and forms a pn junction with a p-type semiconductor substance.
Figure 4:
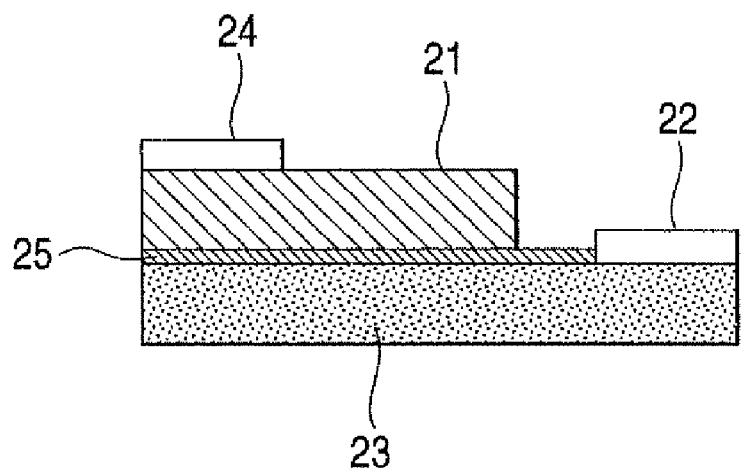
FIG. 4 is a schematic cross sectional view showing an embodiment of the solar cell of the invention, in which a carbon nanotube structure film is employed as an n-type semiconductor substance, and forms a pin junction with a p-type semiconductor substance.

FIGS. 3 and 4 show embodiments of the solar cell of the invention, in which the carbon nanotube structure film is employed as an n-type semiconductor substance.

FIG. 3 is a schematic cross sectional view showing an embodiment of the solar cell of the invention, in which the carbon nanotube structure film is employed as an n-type semiconductor substance, and forms a pn junction with a p-type semiconductor substance.

The solar cell of the embodiment contains a p-type semiconductor layer 23 containing a p-type semiconductor substance. An n-type semiconductor layer 21 containing a carbon nanotube structure film, which is an n-type semiconductor substance, is formed on the whole surface of the p-type semiconductor layer 23 except for an end surface thereof. An electrode 24 is accumulated on the n-type semiconductor layer 21, and an electrode 22 is formed on the end surface of the p-type semiconductor layer 23.

FIG. 4 is a schematic cross sectional view showing an embodiment of the solar cell of the invention, in which the carbon nanotube structure film is employed as an n-type semiconductor substance, and forms a pin junction with a p-type semiconductor substance.

The solar cell of this embodiment has the same constitution as the solar cell shown in FIG. 3, and the same symbols are attached to the corresponding members, except that an intermediate layer (i layer) 25 intervenes between the n-type semiconductor layer 21 and the p-type semiconductor layer 23 to form a pin junction.

In the solar cells of the aforementioned embodiments of the invention, a load is applied between the electrodes 12 and 14 or the electrodes 22 and 24, and the surface (from the above in the figures) thereof is irradiated with light, whereby a voltage and an electric current can be obtained.

The members constituting the solar cells of the embodiments will be described in detail below.
Carbon Nanotube Structure In the solar cell of the invention, the carbon nanotube structure is a structure film containing plural carbon nanotubes arranged in an electrically connected state.

The carbon nanotubes used herein and the structure of the carbon nanotube structure film will be described separately.
Carbon Nanotubes The carbon nanotubes, which are the main constitutional element in the invention, may be either single wall carbon nanotubes (SWNT) or multi-wall carbon nanotubes (MWNT), and are preferably single wall carbon nanotubes, which exhibit semiconductor characteristics by themselves. Either kind of carbon nanotubes can be used without problems as far as the carbon nanotube structure film thus formed totally has p-type or n-type semiconductor characteristics. In the case where no significant difference in semiconductor characteristics of the total carbon nanotube structure film between the cases using single wall carbon nanotubes and multi-wall carbon nanotubes, it may be preferred to use multi-wall carbon nanotubes owing to the low cost thereof.

Variants of single wall carbon nanotubes, which do not have a tube form in strict meaning, may also be used as the carbon nanotubes in the invention, examples of which include carbon nanohorns (having a horn shape where the diameter thereof is continuously increased from one end to the other end), carbon nanocoils (having a coil form in a spiral shape in total), carbon nanobeads (having a tube at the center, which penetrates a spherical bead formed with amorphous carbon and the like), cup-stacked carbon nanotubes, and carbon nanotubes having carbon nanohorns or amorphous carbon covering the outer periphery thereof.

Metal-containing carbon nanotubes encompassing a metal or the like in carbon nanotubes, peapod carbon nanotubes encompassing fullerene or metal-containing fullerene in carbon nanotubes, and carbon nanotubes encompassing some other kinds of substances may also be used as the carbon nanotube in the invention.

As having been described, in addition to the ordinary single wall or multi-wall carbon nanotubes, carbon nanotubes in various configurations, such as variants thereof and carbon nanotubes having been variously modified, can be used in the invention without any problem. Therefore, the concept "carbon nanotubes" referred in the invention includes all those materials.

The carbon nanotubes can be synthesized by the arc discharge process, a laser ablation process and the CVD process, which have been known in the art, and the invention is not limited in production process. Among these, the arc discharge process carried out in a magnetic field is preferred since carbon nanotubes having high purity can be synthesized.

The carbon nanotubes used preferably have a diameter of from 0.3 to 100 nm. In the case where the diameter of the carbon nanotubes exceeds the range, synthesis thereof is difficult to be attained, and it is not preferred from the standpoint of cost. The upper limit of the diameter of the carbon nanotubes is more preferably 30 nm or more.

The lower limit of the diameter of the carbon nanotubes is generally about 0.3 nm in consideration of the structure thereof. There are some cases where the yield upon synthesis is lowered when the carbon nanotube is too thin, and therefore, it is preferably 1 nm or more, and more preferably 10 nm or more.

The carbon nanotubes used preferably have a length of from 0.1 to 100 μm. In the case where the length of the carbon nanotubes exceeds the range, it is not preferred from the standpoint of cost since synthesis thereof is difficult to be attained or necessitates a special process. The upper limit of the length of the carbon nanotubes is more preferably 10 μm, and the lower limit thereof is more preferably 1 μm.

In the case where the carbon nanotubes to be used have not higher purity, it is preferred that the purity is improved by purifying before preparing a precursor coating composition described later. In the invention, the purity of the carbon nanotubes is preferably as high as possible, and specifically, the purity is preferably 90% or more, and more preferably 95% or more. In the case where the purity is low, a crosslinking agent is crosslinked with carbonaceous products, such as amorphous carbon and tar, to fluctuate the crosslinking distance of the carbon nanotubes, whereby there are cases where intended characteristics cannot be obtained. The purifying method of the carbon nanotubes is not particularly limited, and the methods having been known in the art can be employed.

Structure of Carbon Nanotube Structure

The carbon nanotube structure of the invention varies in specific structure depending on whether it is employed as a p-type semiconductor substance or an n-type semiconductor substance.

A-1 Employed as p-Type Semiconductor Substance

The carbon nanotube structure in the case where it is employed as a p-type semiconductor substance in the p-type semiconductor layer 12 shown in FIGS. 1 and 2 has such a constitution that plural carbon nanotubes each having a functional group bonded thereto are crosslinked to each other through chemical bonds with the functional groups to form a network structure. That is, the carbon nanotube structure constituting the network structure exhibits p-type semiconductor characteristics.

The carbon nanotube structure having such a structure contains plural carbon nanotubes forming a network structure through crosslinked parts, whereby excellent characteristics of carbon nanotubes can be utilized as different in the case of a simple carbon nanotube dispersion film or a resin film having carbon nanotubes dispersed therein, in which carbon nanotubes are incidentally in contact with each other but are substantially in an isolated state.

The carbon nanotube structure is preferably formed in such a manner that a precursor coating composition therefor (i.e., a solution containing carbon nanotubes each having a functional group bonded thereto) is coated and cured on the surface of the layer containing an n-type semiconductor substance, whereby the functional groups bonded to the carbon nanotubes are chemically bonded to each other to form crosslinked parts.

In the structure, a first preferred structure of the crosslinked part is such a structure that the plural functional groups are crosslinked to each other with a crosslinking agent contained in the solution, and it is more preferred that the crosslinking agent is non-self-polymerizable.

In the case where the carbon nanotube structure is formed by curing the solution, the crosslinked parts where the carbon nanotubes are crosslinked to each other has such a crosslinked structure that the residual groups, which remain after the crosslinking reaction of the functional groups, are connected through a linking group, which is a residual group of the crosslinking agent remaining after the crosslinking reaction, which improves the electric or thermal conductivity and the mechanical strength.

In the case where the crosslinking agent has a nature of undergoing a polymerization reaction by itself (self-polymerizable nature), there are cases where the linking group contains a polymer of two or more molecules of the crosslinking agent connected to each other. In these cases, the substantial density of carbon nanotubes occupied in the carbon nanotube structure is decreased, and the mechanical and thermal properties cannot be sufficiently exerted in some cases.

In the case where the crosslinking agent is non-self-polymerizable, on the other hand, the distance between the carbon nanotubes can be controlled by the size of the residual group of the crosslinking agent used, whereby an intended network structure of carbon nanotubes can be obtained with high reproducibility. Furthermore, in the case where the size of the residual group of the crosslinking agent is reduced, the distance between the carbon nanotubes is reduced, such a state can be obtained that the carbon nanotubes are extremely closed to each other physically, and the carbon nanotubes in the structure can be densely structuralized.

Therefore, in the case where the crosslinking agent is self-non-polymerizable, the carbon nanotube structure of the invention can exert in high levels the electric characteristics and the mechanical characteristics that the carbon nanotubes inherently have.

The term "self-polymerizable" referred herein means that molecules of the crosslinking agent undergo a polymerization reaction with each other in the presence or absence of another component, such as water, and the term "non-self-polymerizable" referred herein the crosslinking agent does not have such a nature.

In the case where a non-self-polymerizable crosslinking agent is selected as the crosslinking agent, the crosslinked parts where the carbon nanotubes are crosslinked to each other in the carbon nanotube structure mainly have the same structure. The linking group preferably has a hydrocarbon as a skeleton, which preferably has from 2 to 10 carbon atoms. The length of the crosslinked part can be reduced by decreasing the carbon number to make the carbon nanotubes sufficiently close to each other as compared to the length of the carbon nanotubes themselves, whereby a carbon nanotube structure having a network structure that substantially contains only carbon nanotubes can be obtained.

Examples of the functional group include —OH, —COOH, —COOR (wherein R represents a substituted or unsubstituted hydrocarbon group), —COX (wherein X represents a halogen atom), —NH$_2$ and —NCO. At least one group selected from the group consisting of these functional groups is preferably selected, and in this case, the crosslinking agent to be selected is capable of exerting a crosslinking reaction with the functional group thus selected.

Preferred examples of the crosslinking agent include a polyol, a polyamine, a polycarboxylic acid, a polycarboxylate ester, a polycarboxylic acid halide, a polycarbodiimide and a polyisocyanate. At least one crosslinking agent selected from the group consisting of these crosslinking agents is preferably selected, and in this case, the functional group to be selected is capable of exerting a crosslinking reaction with the crosslinking agent thus selected.

It is preferred in the invention that at least one functional group selected from the aforementioned group as the preferred functional group and at least one crosslinking agent selected from the aforementioned group as the preferred crosslinking agent are selected in such a manner that the functional group and the crosslinking agent can undergo a crosslinking reaction with each other, Particularly preferred examples of the functional group include —COOR (wherein R represents a substituted or unsubstituted hydrocarbon group). A carboxyl group can be relatively easily introduced into carbon nanotubes, and furthermore, the resulting substance (i.e., carbon nanotube carboxylic acid) is rich in reactivity, whereby the functional group can be relatively easily converted to —COOR (wherein R represents a substituted or unsubstituted hydrocarbon group) through subsequent esterification. The functional group easily undergoes a crosslinking reaction and is suitable for forming a coated film (i.e., the carbon nanotube structure).

Examples of the crosslinking agent corresponding to the aforementioned functional group include a polyol. A polyol easily forms a firm crosslinked product through curing upon reaction with —COOR (wherein R represents a substituted or unsubstituted hydrocarbon group). In the polyol, glycerin and ethylene glycol have not only good reactivity with the functional group, but also high biodegradability by themselves to provide less environmental burden.

In the case where the functional group is —COOR (wherein R represents a substituted or unsubstituted hydrocarbon group), and the crosslinking agent used is ethylene glycol, the crosslinked part where the plural carbon nanotubes are crosslinked with each other is —COO(CH$_2$)$_2$OCO—, and in the case where the crosslinking agent used is glycerin, the crosslinked part is —COOCH$_2$CHOHCH$_2$OCO— or —COOCH$_2$CH(OCO—)CH$_2$OH where two OH groups contribute to the crosslinking reaction, or is —COOCH$_2$CH(OCO—)CH$_2$OCO— where three OH groups contribute to the crosslinking reaction. The chemical structure of the crosslinked part may be one selected from the aforementioned four chemical structures.

A second preferred structure of the crosslinked part is such a structure that is formed of chemical bonds of plural functional groups. It is preferred that the reaction for forming the chemical bonds is one of a dehydration reaction, a substitution reaction, an addition reaction and an oxidation reaction, The carbon nanotube structure in this case constitutes a network structure by forming crosslinked parts by chemically bonding the functional groups bonded to the carbon nanotubes to crosslink the carbon nanotubes, and therefore, the size of the crosslinked parts for connecting the carbon nanotubes becomes constant depending on the functional groups to be bonded. The carbon nanotubes have a significantly stable chemical structure and have a low possibility of reacting with other functional groups than the functional groups to be bonded, and in the case where the functional groups are chemically bonded to each other, the crosslinked parts can have a designed structure to provide a carbon nanotube structure having a uniform structure.

In the second preferred structure, furthermore, owing to the chemical bonds between the functional groups, the length of the crosslinked part between the carbon nanotubes can be shortened as compared to the case where the crosslinked part is formed with a crosslinking agent, whereby a dense carbon nanotube structure can be obtained to facilitate utilization of the peculiar advantages of carbon nanotubes.

The chemical bond between the plural functional groups is preferably at least one selected from —COOCO—, —O—, —NHCO—, —COO— and —NCH— for the condensation reaction, at least one selected from —NH—, —S— and —O—, —NHCOO— for the addition reaction, and —S—S— for the oxidation reaction.

Examples of the functional group bonded to the carbon nanotubes before the reaction include —OH, —COOH, —COOR (wherein R represents a substituted or unsubstituted hydrocarbon group), —X, —COX (wherein X represents a halogen atom), —SH, —CHO, —OSO$_2$CH$_3$, —OSO$_2$(C$_6$H$_4$)CH$_3$, —NH$_2$ and —NCO, and it is preferred to select at least one group selected from the group consisting of these groups.

Particularly preferred examples of the functional group include —COOH. A carboxyl group can be relatively easily introduced into carbon nanotubes. Furthermore, the resulting substance (i.e., carbon nanotube carboxylic acid) is rich in reactivity and easily undergoes a condensation reaction by utilizing a dehydration condensation agent, such as N-ethyl-N-(3-diemthylaminopropyl)carbodiimide, and therefore, it is suitable for forming a coated film (i.e., the carbon nanotube structure).

The carbon nanotubes used in this case are preferably single wall carbon nanotubes having semiconductor characteristics by themselves, and multi-wall carbon nanotubes can also be used. In the later case, however, there are cases where the multi-wall carbon nanotubes exhibit n-type semiconductor characteristics, and in these cases, they can be employed as the n-type semiconductor substance described later.

A-2 Employed as n-Type Semiconductor Substance

The carbon nanotube structure in the case where it is employed as an n-type semiconductor substance in the n-type semiconductor layer 21 shown in FIGS. 3 and 4 preferably has such a constitution that has plural carbon nanotubes dispersed therein. That is, in the case where the carbon nanotubes are randomly arranged therein and form electroconductivity through only physical contact, they exhibit n-type semiconductor characteristics. In the case where a carbon nanotube structure having the aforementioned crosslinked structure exhibits n-type semiconductor characteristics, it can be employed as the n-type semiconductor substance in the n-type semiconductor layer 21.

The carbon nanotube structure can be obtained in various manners. For example, the carbon nanotubes are dispersed in a suitable dispersing medium, and the dispersion liquid is coated and dried to evaporate the dispersion medium to obtain a carbon nanotube structure containing only the carbon nanotubes, or in alternative, the carbon nanotubes are uniformly dispersed in a resin solution formed by dissolving a binder resin in a solvent, and the mixture is coated and dried to evaporate the solvent to obtain a carbon nanotube structure containing the carbon nanotubes dispersed in the binder resin.

In the former case, the carbon nanotube structure is excellent in electric characteristics owing to the increased chances of physical contact among the carbon nanotubes, but is inferior in mechanical strength as a structural body. In the later case, on the other hand, the carbon nanotube structure is inferior in electric characteristics since the carbon nanotubes have less chances of physical contact, and the physical contact is difficult to control. However, the carbon nanotube structure in the later case is considerably excellent in mechanical strength as a structural body.

In the former case, the specific production process, a preferred dispersion medium, the concentration and the formulation can be appropriately selected. Carbon nanotubes are generally not dissolved in an organic solvent, and therefore, both an aqueous solvent and an organic solvent may be used. In the later case, the specific production process, the preferred binder resin and solvent, the concentration and the formulation may be appropriately selected. In particular, the binder resin is preferably selected to satisfy the transparency, the electric characteristics and the mechanical characteristics as a semiconductor layer of a solar cell, and specific examples thereof include polycarbonate, an acrylic resin, polystyrene, polyamide and polyethylene terephthalate (PET).

In the case where such a carbon nanotube structure is to be obtained that is in the form of a thin film, has uniformity and exhibits n-type semiconductor characteristics, it is preferred that the carbon nanotube structure is produced as an LB film (Langmuir-Blodgett film). That is, the second embodiment of the production process of a solar cell according to the invention described later is preferably applied to the production process of the carbon nanotube structure. Details thereof will be described later.

n-Type Semiconductor Substance

As the n-type semiconductor substance in the n-type semiconductor layer 11 in the case where the carbon nanotube structure film is employed as the p-type semiconductor substance in the p-type semiconductor layer 13 shown in FIGS. 1 and 2, the conventionally known substances exhibiting n-type semiconductor characteristics can be used without problems. Specific examples thereof include an n-type silicon (n-Si) semiconductor, an n-type germanium semiconductor, an n-type gallium arsenic (n-GaAs) semiconductor, an n-type indium arsenic (n-InAs) semiconductor, an n-type indium antimony (n-InSb) semiconductor, an n-type indium phosphorous (InP) semiconductor, an n-type Group IV-IV compound semiconductor, an n-type Group III-V compound semiconductor, an n-type Group II-VI compound semiconductor, an oxide semiconductor, such as titanium oxide and tin oxide, and an organic n-type semiconductor.

Among these, a GaAs semiconductor, an InP semiconductor and an Si semiconductor are preferred since the band gap is close to the radiation energy spectrum of sunlight to improve the conversion efficiency, and an Si semiconductor is most preferred in consideration of easiness in production process and production cost.

The n-type semiconductor layer 11 can be produced by the conventionally known process, which is not limited in the invention. The various conditions including the thickness of the layer may be appropriately designed depending on cases.

p-Type Semiconductor Substance

As the p-type semiconductor substance in the p-type semiconductor layer 23 in the case where the carbon nanotube structure film is employed as the n-type semiconductor substance in the n-type semiconductor layer 21 shown in FIGS. 3 and 4, the conventionally known substances exhibiting p-type semiconductor characteristics can be used without problems. Specific examples thereof include an p-type silicon (p-Si) semiconductor, an p-type germanium semiconductor, an p-type gallium arsenic (p-GaAs) semiconductor, an p-type indium arsenic (p-InAs) semiconductor, an p-type indium antimony (p-InSb) semiconductor, an p-type indium phosphorous (InP) semiconductor, a p-type Group IV-IV compound semiconductor, a p-type Group III-V compound semiconductor, a p-type Group II-VI compound semiconductor, and an organic p-type semiconductor.

In the p-type semiconductor layer, as similar to the n-type semiconductor layer, a GaAs semiconductor, an InP semiconductor and an Si semiconductor are preferred since the band gap is close to the radiation energy spectrum of sunlight to improve the conversion efficiency, and an Si semiconductor is most preferred in consideration of easiness in production process and production cost.

The p-type semiconductor layer 23 can be produced by the conventionally known process, which is not limited in the invention. The various conditions including the thickness of the layer may be appropriately designed depending on cases.

Intermediate Layer (i Layer)

The intermediate layer (i layer) 15 or 25 in the constitutions shown in FIGS. 2 and 4 is an intrinsic semiconductor layer, and for example, a layer of an intrinsic semiconductor, such as amorphous silicon, is positively formed, or in alternative, a surface oxide film of an inorganic semiconductor layer of n-type or p-type is used as the intermediate layer (i layer). For example, a silicon (Si) semiconductor layer or a silicon (Si) substrate forms a surface oxide film upon making in contact with the air, and the oxide film may constitute the intermediate layer (i layer). There are many cases where a surface oxide film is similarly formed in other semiconductors, and the n-type or p-type carbon nanotube structure film is formed on the surface of the p-type or n-type semiconductor layer or substrate to form a pin junction.

There are cases where it is difficult to determine as to whether or not the intermediate layer (i layer) is certainly formed depending on the thickness of the surface oxide film and the conditions for forming the film, and it is difficult to determine as to whether a pn junction or a pin junction is formed. However, there is substantially no meaning to determine the cases. In the invention, it is sufficient that the intended solar cell can be obtained as a result of formation of a pn junction, a pin junction or a junction in an intermediate state between them.

Electrode

The electrodes 12, 14, 22 and 24 in FIGS. 1 to 4 are not particularly limited as far as they can form electroconductivity to the semiconductor layers, and can be formed in the process having been used for the ordinary electrode by using a material having been used as the ordinary electrode.

Specific examples of the material that is generally used as the electrode include various metals, such as gold, platinum, copper, silver, aluminum, titanium and combinations thereof. Examples of the process generally used for producing the electrode include various vapor deposition techniques.

Production Process of Solar Cell

One of the characteristic feature of the solar cell of the invention resides in the carbon nanotube structure film, and therefore, the production process of a solar cell of the invention can be characterized by the production process of the carbon nanotube structure film. The other constitutional members (e.g., the semiconductor layer, for which the carbon nanotube structure film is not employed, and the electrode) can be produced in the conventionally known processes, and the invention is not limited thereto.

Accordingly, in the following description, only the production process of the carbon nanotube structure film, which is the characteristic feature of the invention, will be described.

The production process of the carbon nanotube structure film varies depending on whether the carbon nanotube structure is employed as a p-type semiconductor substance or an n-type semiconductor substance, and these cases will be described separately.

B-1 Employed as p-Type Semiconductor Substance

The production process of the invention that is suitable for forming the carbon nanotube structure employed as the p-type semiconductor substance in the p-type semiconductor layer 13 shown in FIGS. 1 and 2 (hereinafter, sometimes simply referred to as the first production process) contains feeding a solution containing plural carbon nanotubes each having a functional group bonded thereto (a precursor solution of the carbon nanatube structure film), to a surface of a layer containing an n-type semiconductor substance, and crosslinking the carbon nanotubes to each other through chemical bonds with the plural functional groups to form a carbon nanotube structure having a network structure containing the plural carbon nanotubes crosslinked to each other.

In the first production process of the invention, a feeding step is carried out by feeding a solution containing carbon nanotubes each having a functional group bonded thereto (a precursor solution of the carbon nanotube structure film, hereinafter which is sometimes simply referred to as a precursor coating composition) to the surface of the n-type semiconductor layer 11 to form a film of the precursor coating composition. Thereafter, in the subsequent crosslinking step, the structure is cured to form a carbon nanotube structure having a network structure containing the plural carbon nanotubes crosslinked to each other. The structure of the carbon nanotube structure constituting the p-type semiconductor layer 13 is stabilized on the surface of the n-type semiconductor layer 11 (or the intermediate layer (i layer) 15) through the aforementioned two steps.

(A) Feeding Step

The feeding step in the invention is a step of feeding the precursor coating composition to the surface of the n-type semiconductor layer 11.

In this step, the feeding operation may be carried out by using the aforementioned precursor coating composition, and in a simple embodiment, the precursor coating composition may be coated on the surface of the n-type semiconductor layer 11. A film for forming the carbon nanotube structure can be fed in a convenient and low cost manner in a short period of time by the coating method.

The coating method is not particularly limited, and wide varieties of methods including simply dropping the coating composition, spreading the coating composition thus dropped, and various ordinary coating methods. Examples of the ordinary coating method include the spin coating method, a wire bar coating method, a cast coating method, a roll coating method, a brush coating method, a dip coating method, a spray coating method and a curtain coating method.

The carbon nanotubes used are used in the form of they have the prescribed functional groups added thereto, for forming the carbon nanotube structure. The preferred functional group added herein varies depending on whether the first structure or the second structure is employed. The functional group in the former case is referred to as a functional group 1, and that in the later case is referred to as a functional group 2.

The first process for producing the carbon nanotube structure having the first structure and the second process for producing the carbon nanotube structure having the second structure will be described separately below.

First Process

In the first process, in which the crosslinked part is formed by using a crosslinking agent, the functional group connected to the carbon nanotubes is not particularly limited, and any functional group may be selected, as far as it can be chemically added to the carbon nanotubes and can undergo a crosslinking reaction with a certain crosslinking agent. Specific examples of the functional group include —COOR, —COX, —MgX, —X (wherein X represents a halogen atom), —OR, —NR$^1$R$^2$, —NCO, —NCS, —COOH, —OH, —NH$_2$, —SH, —SO$_3$H, —R'CHOH, —CHO, —CN, —COSH, —SR and —SiR'$_3$ (wherein R R$^1$, R$^2$ and R' each independently represents a substituted or unsubstituted hydrocarbon group, preferably is selected from —C$_n$H$_{2n-1}$, and —C$_n$H$_{2n+1}$, wherein n represents an integer of from 1 to 10, which may be substituted, and more preferably a methyl group or an ethyl group). The invention is not limited to these groups.

Among these, at least one group selected from the group consisting of —OH, —COOH, —COOR (wherein R represents a substituted or unsubstituted hydrocarbon group, and preferably is selected from —C$_n$H$_{2n-1}$, —C$_n$H$_{2n}$ and —C$_n$H$_{2n+1}$, wherein n represents an integer of from 1 to 10, which may be substituted), —COX (wherein X represents a halogen atom), —NH$_2$ and —NCO. In this case, the crosslinking agent is selected in such a manner that it can undergo a crosslinking reaction with the functional group thus selected.

In particular, —COOR (wherein R has the same meaning as above) is particularly preferred. This is because a carboxyl group can be relatively easily introduced into carbon nanotubes, and the functional group can be easily introduced by subjecting the resulting substance (i.e., carbon nanotube carboxylic acid) to esterification. This is also because the functional group is good in reactivity with the crosslinking agent.

The substituent R in the functional group —COOR is a substituted or unsubstituted hydrocarbon group and is not particularly limited, and it is preferably an alkyl group having from 1 to 10 carbon atoms, more preferably an alkyl group having from 1 to S carbon atoms, and particularly preferably a methyl group or an ethyl group, from the standpoint of reactivity, solubility, viscosity and usability as a solvent for a coating composition.

The amount of the functional groups thus introduced varies depending on the length and the thickness of the carbon nanotubes, the structure of the carbon nanotubes, i.e., the single wall or the multi-wall, the species of the functional group, and the purpose of the composite material, and cannot be determined unconditionally, and it is preferably such an amount that two or more functional groups are attached to one carbon nanotube from the standpoint of strength of the resulting crosslinked product, i.e., the strength of the structure.

The method for introducing the functional group into the carbon nanotubes will be described in the later chapter "Production Process of Composite Material".

Crosslinking Agent

In the first process, a crosslinking agent is essential. Any crosslinking agent may be used that undergoes a crosslinking reaction with the functional group contained in the carbon nanotubes. In other words, the species of the crosslinking agent that can be selected is restricted to some extent depending on the species of the functional group. The curing conditions (e.g., heating, ultraviolet ray irradiation, visible ray irradiation and spontaneous curing) is also determined depending on the combination thereof.

Preferred examples of the crosslinking agent include a polyol, a polyamine, a polycarboxylic acid, a polycarboxylate ester, a polycarboxylic acid halide, a polycarbodiimide and a polyisocyanate, and at least one crosslinking agent selected from the group consisting of these crosslinking agents is preferably selected. In this case, such a functional group is selected that is capable of undergoing a crosslinking reaction with the crosslinking agent thus selected.

It is preferred that at least one functional group and at least one crosslinking agent are selected from the group of the preferred functional groups and the group of the preferred crosslinking agents, respectively, in such a manner that they are capable of undergoing a crosslinking reaction. Examples of the combinations of the functional group contained in the carbon nanotubes and the crosslinking agent capable of being reacted therewith are shown in Table 1 below along with the curing conditions therefor.

TABLE 1

| Functional group contained in carbon nanotubes | Crosslinking agent | Curing condition |
|---|---|---|
| —COOR | polyol | heat curing |
| —COX | polyol | heat curing |
| —COOH | polyamine | heat curing |
| —COX | polyamine | heat curing |
| —OH | polycarboxylate ester | heat curing |
| —OH | polycarboxylic acid halide | heat curing |
| —$NH_2$ | polycarboxylic acid | heat curing |
| —$NH_2$ | polycarboxylic acid halide | heat curing |
| —COOH | polycarbodiimide | heat curing |
| —OH | polycarbodiimide | heat curing |
| —$NH_2$ | polycarbodiimide | heat curing |
| —NCO | polyol | heat curing |
| —OH | polyisocyanate | heat curing |
| —COOH | ammonium complex | heat curing |
| —COOH | hydroquinone | heat curing |

Note:
R: substituted or unsubstituted hydrocarbon group
X: halogen atom

Among these combinations, preferred examples thereof include combinations of —COOR (wherein R represents a substituted or unsubstituted hydrocarbon group, and preferably is selected from —$C_nH_{2n-1}$, —$C_nH_{2n}$ and —$C_nH_{2n+1}$, wherein n represents an integer of from 1 to 10, which may be substituted) good in reactivity as the functional group with a polyol, a polyamine, an ammonium complex, conga red and cis-platin.

The term "polyol" referred herein is a generic name of an organic compound having two or more OH groups, and among these, compounds having from 2 to 10 (preferably from 2 to 5) carbon atoms and from 2 to 22 (preferably from 2 to 5) OH groups are preferred from the standpoint of crosslinking property, compatibility with a solvent upon excessive addition, processability of a waste liquid through biodegradation after reaction (environmental compatibility), and yield in polyol synthesis. In particular, the carbon number is preferably as small as possible within the aforementioned range since the distances among the carbon nanotubes in the resulting structure can be reduced to obtain an (approximate) contact state. Specifically, glycerin and ethylene glycol are particularly preferred, and one or both thereof are preferably used as the crosslinking agent.

In a different perspective, the crosslinking agent is preferably a non-self-polymerizable crosslinking agent. Glycerin and ethylene glycol as exemplified as the polyol, as well as butenediol, hexynediol, hydroquinone and naphthalenediol, are non-self-polymerizable crosslinking agents, and in more generic definition, the non-self-polymerizable crosslinking agent has no such a combination of functional groups therein that undergo a polymerization reaction with each other. In other words, the self-polymerizable crosslinking agent has such a combination of functional groups therein that undergo a polymerization reaction with each other (for example, an alkoxide).

The content of the carbon nanotubes in the precursor coating composition varies depending on the length and the thickness of the carbon nanotubes, the structure of the carbon nanotubes, i.e., the single wall or the multi-wall, the species and the amount of the functional group contained therein, the species and the amount of the crosslinking agent, the presence or absence, the species and the amounts of the solvent and the other additives, and the like, and cannot be determined unconditionally. It is preferably such a high concentration that a favorable crosslinked film can be formed after curing, but the concentration is preferably not too high for preventing the coating applicability from being deteriorated.

The specific proportion of the carbon nanotubes except for the mass of the functional groups may be, while it cannot be determined unconditionally as having been noted, selected from a range of from 0.01 to 10 g/L, preferably from 0.1 to 5 g/L, and more preferably from 0.5 to 1.5 g/L, based on the total amount of the crosslinking solution.

In the precursor coating composition, a solvent may be added in the case where the coating applicability is insufficient only with the crosslinking agent. The solvent that can be used herein is not particularly limited and can be selected depending on the species of the crosslinking used. Specific examples thereof include an organic solvent, such as methanol, ethanol, isopropanol, n-propanol, butanol, methyl ethyl ketone, toluene, benzene, acetone, chloroform, methylene chloride, acetonitrile, diethyl ether and tetrahydrofuran (THF), water, an acidic aqueous solution and an alkaline aqueous solution. The addition amount of the solvent may be appropriately determined under consideration of the coating applicability and is not particularly limited.

Second Process

In the second process, in which the plural functional groups are chemically bonded to each other directly without a crosslinking agent to form the crosslinked parts, the functional group contained in the carbon nanotubes is not particularly limited and may be an arbitrary functional group, as far as it can be chemically added to the carbon nanotubes and can react the functional groups themselves with each other upon addition of some kinds of an additive.

Specific examples of the functional group include —COOR, —COX, —MgX, —X (wherein X represents a halogen atom), —OR, —NR$^1$R$^2$, —NCO, —NCS, —COOH, —OH, —NH$_2$, —SH, —SO$_3$H, —R'CHOH, —CHO, —CN, —COSH, —SR and —SiR'$_3$ (wherein R, R$^1$, R$^2$ and R' each independently represents a substituted or unsubstituted hydrocarbon group, preferably is selected from —C$_n$H$_{2n-1}$, —C$_n$H$_{2n}$ and —C$_n$H$_{2n+n}$, wherein n represents an integer of from 1 to 10, which may be substituted, and more preferably a methyl group or an ethyl group), but it is not limited thereto.

As the reaction for chemically bonding the functional groups with each other, a dehydration condensation reaction, a substitution reaction, an addition reaction and an oxidation reaction are particularly preferred. Preferred examples of the functional group for the dehydration condensation reaction include —COOR (wherein R represents a substituted or unsubstituted hydrocarbon group, and preferably is selected from —C$_n$H$_{2n-1}$, —C$_n$H$_{2n}$ and —C$_n$H$_{2n+1}$, wherein n represents an integer of from 1 to 10, which may be substituted), —COOH, —COX (wherein X represents a halogen atom), —OH, —CHO and —NH$_2$, those for the substitution reaction include —NH$_2$, —X (wherein X represents a halogen atom), —SH, —OH, —OSO$_2$CH$_3$ and —OSO$_2$(C$_6$H$_4$)CH$_3$, those for the addition reaction include —OH and —NCO, and those for the oxidation reaction include —SH.

It is also possible that a molecule having the functional group as a part thereof is bonded to the carbon nanotubes, which are then chemically bonded at the part of the preferred functional groups. In this case, the length of the crosslinked parts can be controlled since the functional group having a large molecular weight is bonded to the carbon nanotubes in the intended manner.

Upon chemically bonding the functional groups with each other, an additive that causes the chemical bonds among the functional groups may be used. Any additive may be used that causes reaction among the functional groups contained in the carbon nanotubes. In other words, the species of the additive that can be selected is restricted to some extent depending on the species of the functional group. The curing conditions (e.g., heating, ultraviolet ray irradiation, visible ray irradiation and spontaneous curing) is also determined depending on the combination thereof.

In the case where the reaction of chemically bonding the functional groups is a dehydration condensation reaction, a condensing agent is preferably added as the additive. Preferred examples of the condensing agent include sulfuric acid, N-ethyl-N'-(3-methylaminopropyl)carbodiimide and dicyclohexylcarbodiimide, and it is preferred that at least one selected from the group consisting of these condensing agents is selected. In this case, the functional groups are selected in such a manner that they undergo reaction among them with the condensing agent thus selected.

The functional group used in the dehydration condensation reaction is preferably at least one selected from the group consisting of —COOR (wherein R represents a substituted or unsubstituted hydrocarbon group), —COOH, —COX (wherein X represents a halogen atom), —OH, —CHO and —NH$_2$.

The functional group used in the dehydration condensation reaction is particularly preferably —COOH. A carboxyl group can be relatively easily introduced into a carbon nanotube, and furthermore, the resulting substance (i.e., carbon nanotube carboxylic acid) is rich in reactivity. Accordingly, the functional groups for forming the network structure can be easily introduced into plural positions per one carbon nanotube, and the functional group can easily undergo dehydration condensation and is suitable for forming the carbon nanotube structure. In the case where the functional group used in the dehydration condensation reaction is —COOH, particularly preferred examples of the condensing agent include sulfuric acid, N-ethyl-N'-(3-methylaminopropyl) carbodiimide and dicyclohexylcarbodiimide.

In the case where the reaction of chemically bonding the functional groups is a substitution reaction, a base is preferably added as the additive. The base that can be added is not particularly limited, and an arbitrary base can be selected depending on the acidity of the hydroxyl group.

Specific examples of the base include sodium hydroxide, potassium hydroxide, pyridine and sodium ethoxide, and it is preferred that at least one base selected from the group consisting of these bases is selected. In this case, the functional groups are selected in such a manner that they undergo reaction among them with the base thus selected. The functional group used in this case is preferably at least one selected from the group consisting of —NH$_2$, —X (wherein X represents a halogen atom), —SH, —OH, —OSO$_2$CH$_3$ and —OSO$_2$(C$_6$H$_4$)CH$_3$.

In the case where the reaction of chemically bonding the functional groups is an addition reaction, the additive is not always necessary. The functional group in this case is preferably —OH and/or —NCO.

In the case where the reaction of chemically bonding the functional groups is an oxidation reaction, the additive is not always necessary, and an oxidation reaction accelerator is preferably added as the additive. Preferred examples of the oxidation reaction accelerator include iodine. The functional group in this case is preferably —SH.

It is preferred that at least two kinds of functional groups are selected from the groups of the preferred functional groups having been described in such a manner that the functional groups are reacted with each other, and the functional groups are added to the carbon nanotubes. Preferred examples of the combination of the functional groups (A) and (B) capable of undergoing the crosslinking reaction with each other contained in the carbon nanotubes, and the reaction name corresponding thereto are listed in Table 2 below.

TABLE 2

| Crosslinked part | Functional group contained in carbon nanotubes | | Reaction |
| --- | --- | --- | --- |
| | (A) | (B) | |
| —COOCO— | —COOH | —COOH | dehydration condensation |
| —S—S— | —SH | —SH | oxidation |
| —O— | —OH | —OH | dehydration condensation |
| —NH—CO— | —COOH | —NH$_2$ | dehydration condensation |
| —COO— | —COOH | —OH | dehydration condensation |
| —COO— | —COOR | —OH | dehydration condensation |
| —COO— | —COX | —OH | dehydration condensation |
| —CH=N— | —CHO | —NH$_2$ | dehydration condensation |
| —NH— | —NH$_2$ | —X | substitution |
| —S— | —SH | —X | substitution |
| —O— | —OH | —X | substitution |
| —O— | —OH | —OSO$_2$CH$_3$ | substitution |

TABLE 2-continued

| Crosslinked part | Functional group contained in carbon nanotubes (A) | (B) | Reaction |
|---|---|---|---|
| —O— | —OH | —SO$_2$(C$_6$H$_4$)CH$_3$ | substitution |
| —NH—COO— | —OH | —N=C=O | addition |

Note:
R: substituted or unsubstituted hydrocarbon group
X: halogen atom

The concept relating to the content of the carbon nanotubes in the precursor coating composition is basically the same as in the first process.

The content of the additive in the precursor coating composition varies depending on the species of the additive, and also depending on the length and the thickness of the carbon nanotubes, the structure of the carbon nanotubes, i.e., the single wall or the multi-wall, the species and the amount of the functional group contained therein, the presence or absence, the species and the amounts of the solvent and the other additives, and the like, and cannot be determined unconditionally. In particular, glycerin and ethylene glycol having not higher viscosity can be added also as a solvent, and therefore, they may be added in an excessive amount.

In the precursor coating composition, the solvent may be added in the case where the coating applicability is insufficient only with the crosslinking agent. The solvent that can be used herein is not particularly limited and can be selected depending on the species of the additive used. Specific examples of the species of the solvent and the addition amount thereof are the same as in the case of the solvent in the first process.

Other Additives

The precursor coating composition (including those of the first and the second processes) may contain other additives, such as a viscosity adjusting agent, a dispersant and a crosslinking accelerator.

The viscosity adjusting agent may be added in the case where the coating applicability is insufficient only with the crosslinking agent or the additive for bonding the functional groups. The viscosity adjusting agent that can be used is not particularly limited, and can be selected depending on the species of the crosslinking agent used. Specific examples thereof include methanol, ethanol, isopropanol, n-propanol, butanol, methyl ethyl ketone, toluene, benzene, acetone, chloroform, methylene chloride, acetonitrile, diethyl ether and tetrahydrofuran (THF).

Some of the viscosity adjusting agents function as a solvent depending on the addition amount thereof, and there is no significance to distinguish them clearly. The addition amount of the viscosity adjusting agent is not particularly limited and can be appropriately determined under consideration of the coating applicability.

The dispersant is added for maintaining dispersion stability of the carbon nanotube and the crosslinking agent or the additive for bonding the functional groups in the precursor coating composition, and various kinds of surfactants, water soluble organic solvents, water, acidic aqueous solutions and alkaline aqueous solutions having been known in the art can be used. However, the dispersant is not always necessary since the components of the precursor coating composition have high dispersion stability by themselves. There are some cases where impurities, such as the dispersant, are not contained in the crosslinked film depending on purposes of the crosslinked film thus formed, and in these cases, the dispersant is not added or is added in an amount as small as possible.

Preparation Method of Precursor Coating Composition

The preparation method of the precursor coating composition will be described.

The precursor coating composition may be prepared by mixing the carbon nanotubes each having a functional group with the crosslinking agent that undergoes a crosslinking reaction with the functional group or the additive for chemically bonding the functional group (mixing step). Prior to the mixing step, an addition step for introducing the functional group into carbon nanotubes may be carried out.

In the case where carbon nanotubes each having a functional group are used as a starting material, only the operation of the mixing step may be carried out, and in the case where ordinary carbon nanotubes are used as a starting material, the operation may be started from the addition step.

Addition Step

The addition step is a step for introducing the desired functional group into carbon nanotubes. The introducing method varies depending on the species of the functional group and cannot be described unconditionally. The desired functional group may be directly added, but it is also possible that a functional group that can be easily added is once introduced, and the a part of the functional group is substituted, or another functional group is added to the functional group, so as to obtain the target functional group.

Such another method may also be employed that a mechanochemical force is applied to carbon nanotubes to break or modify only small parts of graphene sheets on the surface of the carbon nanotubes, to which various kinds of functional groups are added.

The functional group can be relatively easily introduced to cup-stacked carbon nanotubes and carbon nanotubes formed through the vapor phase growing method having many defects on the surface thereof upon production. However, carbon nanotubes having a complete graphene sheet structure are preferably used. This is because the characteristics of the carbon nanotubes can be effectively obtained, and owing to the easiness in controlling the characteristics, by using multi-wall carbon nanotubes, defects suitable for the radiation devices are formed on the outermost layer, to which the functional groups are bonded for crosslinking, and the inner layer having less structural defects is used for exhibiting the characteristics of the carbon nanotubes.

The operation of the addition step is not particularly limited, and all the methods having been known in the art may be utilized. It is further described in JP-A-2002-503204, which can be utilized in the invention depending on purposes.

A method for introducing —COOR (wherein R represents a substituted or unsubstituted hydrocarbon group, and preferably is selected from —C$_n$H$_{2n-1}$, —C$_n$H$_{2n}$ and —C$_n$H$_{2n+1}$, wherein n represents an integer of from 1 to 10, which may be substituted), which is particularly preferred among the aforementioned functional groups, will be described. In order to introduce —COOR (wherein R has the same meaning as above) into carbon nanotubes, (i) a carboxyl group is once introduced into carbon nanotubes, and then (ii) it is esterified.

Addition of Carboxyl Group

In order to introduce a carboxyl group into carbon nanotubes, they may be refluxed with an acid having oxidation function. This operation is preferred since it can be relatively easily carried out, and a carboxyl group rich in reactivity can be added. The operation will be briefly described.

Examples of the acid having oxidation function include concentrated nitric acid, hydrogen peroxide, a mixed solution of sulfuric acid and nitric acid and aqua regia. In the case where concentrated nitric acid is used, in particular, the concentration thereof is preferably 5% by weight or more, and more preferably 60% by weight or more.

The reflux may be carried out according to the ordinary method, and the temperature is preferably around the boiling point of the acid used. For example, the temperature is preferably in a range of from 120 to 130° C. for concentrated nitric acid. The period of time for refluxing is preferably in a range of from 30 minutes to 20 hours, and more preferably from 1 to 8 hours.

The carbon nanotubes having carboxyl groups added (carbon nanotube carboxylic acid) are formed in the reaction solution after refluxing, which is cooled to room temperature and subjected to, depending on necessity, separation and washing, so as to obtain the target carbon nanotube carboxylic acid.

(ii) Esterification

The esterification of the resulting carbon nanotube carboxylic acid can be carried out by adding an alcohol through dehydration to introduce the target functional group —COOR (wherein R represents a substituted or unsubstituted hydrocarbon group, preferred examples of which are the same as above).

The alcohol used in the esterification is determined by the substituent R in the chemical formula of the functional group. That is, in the case where R represents $CH_3$, methanol is used, and in the case where R represents $C_2H_5$, ethanol is used.

In general, a catalyst is used for esterification, and a known catalyst, such as sulfuric acid, hydrochloric acid and toluenesulfonic acid, may be used in the invention. In the invention, sulfuric acid is preferably used as the catalyst since it causes no side reaction, The esterification can be carried out in such a manner that the alcohol and the catalyst are added to the carbon nanotube carboxylic acid and are refluxed at a suitable temperature for a suitable period of time. The temperature conditions and the time conditions herein vary depending on the species of the catalyst, the species of the alcohol, and the like, and cannot be determined unconditionally. The refluxing temperature is preferably around the boiling point of the alcohol used. For example, the temperature is preferably in a range of from 60 to 70° C. for methanol. The period of time for refluxing is preferably in a range of from 1 to 20 hours, and more preferably in a range of from 4 to 6 hours.

A reaction product is separated from the reaction solution after the esterification, followed by washing depending on necessity, so as to obtain carbon nanotubes having the functional group —COOR (wherein R represents a substituted or unsubstituted hydrocarbon group, preferred examples of which are the same as above) added thereto.

Mixing Step

In the mixing step, the carbon nanotubes each having a functional group are added with the crosslinking agent capable of undergoing crosslinking reaction with the functional group or the additive for bonding the functional groups, so as to prepare a precursor coating composition. In the mixing step, the other additives described in the chapter "Other Additives" may be mixed depending on necessity, in addition to the carbon nanotubes each having a functional group and the crosslinking agent. It is preferred that the addition amounts of the solvent and the viscosity adjusting agent are adjusted in consideration of the coating applicability to prepare a precursor coating composition immediately before feeding to (coating on) the n-type semiconductor layer 11.

The mixing operation may be carried out by simply stirring with spatula or only stirring with a stirrer having stirring blades, a magnetic stirrer or a stirring pump, and the components may be strongly dispersed by using an ultrasonic dispersing machine or a homogenizer, whereby the carbon nanotubes are dispersed more uniformly to improve storage stability and to make a network structure formed by crosslinking the carbon nanotubes spread over the entire structure. In the case where a stirring machine having a strong shearing force for stirring, such as a homogenizer, is used, however, there is such a possibility that the carbon nanotubes contained are broken or damaged, and the stirring operation may be carried out for a short period of time.

(B) Crosslinking Step

The "crosslinking step" in the invention is a step of crosslinking the functional groups contained in the carbon nanotubes with a chemical bond to form a crosslinked part, so as to form the carbon nanotube structure. In the case where the feeding step is a step of coating the precursor coating composition, it is a step of curing the precursor coating composition after coating to form the carbon nanotube structure containing the plural carbon nanotubes crosslinked with each other to form a network structure. The area, on which the carbon nanotube structure is to be formed, in the crosslinking step may contain at least the aforementioned desired area, and the entire solution coated on the surface of the substrate may not necessarily be cured.

The operation in the crosslinking step is determined depending on the combination of the functional group and the crosslinking agent, as shown, for example, in Table 1. In the case of a thermosetting combination, the coating composition may be heated with various kinds of heaters, and in the case of an ultraviolet curing combination, the coating composition may be irradiated with an ultraviolet ray lamp or may be allowed to stand under the sun. In the case of a spontaneous curing combination, the coating composition may be allowed to stand as it is, and the operation of allowing to stand herein is encompassed in the operation carried out in the crosslinking step of the invention.

In the case of the combination of the carbon nanotubes each having the functional group —COOR (wherein R represents a substituted or unsubstituted hydrocarbon group, preferred examples of which are the same as above) and a polyol (particularly, glycerin and/or ethylene glycol), curing (polyesterification through ester exchanging reaction) is attained by heating. Upon heating, —COOR of the esterified carbon nanotube carboxylic acid and $R^1$—OH (wherein R' represents a substituted or unsubstituted hydrocarbon group, and preferably is selected from —$C_nH_{2n-1}$, —$C_nH_{2n}$ and —$C_nH_{2n+1}$, wherein n represents an integer of from 1 to 10, which may be substituted) of the polyol undergo ester exchanging reaction. The reaction proceeds multiply and multi-dimensionally to crosslink the carbon nanotubes, and finally the carbon nanotubes are connected to each other to form the carbon nanotube structure having a network structure.

The preferred conditions for the aforementioned combination may be, for example, a heating temperature of from 50 to 500° C., and more preferably from 120 to 200° C. The heating time for the combination may be preferably from 1 minute to 10 hours, and more preferably from 1 to 2 hours.

The carbon nanotube structure produced by the first production process of the invention has such a state that the carbon nanotubes are networked, More specifically, the carbon nanotube structure is cured in a matrix form, in which the carbon nanotubes are connected to each other through the crosslinked parts, and thus, the characteristics peculiar to carbon nanotubes, such as high transmission characteristics of electrons and holes, can be sufficiently exhibited. In other words, the carbon nanotubes structure contains carbon nanotubes closely connected and contains no other binder, and thus it is substantially formed only with carbon nanotubes, whereby the inherent characteristics of the carbon nanotubes can be exhibited to the maximum extent.

In the carbon nanotube structure film produced by the first production process of the invention, the thickness of the film is not particularly limited and may be selected from a wide range of from an extremely thin layer to a thick layer. In consideration of capability of a solar cell, the thickness of the carbon nanotube structure film is preferably selected from the range of from 10 nm to 5 µm, and more preferably selected from the range of from 100 nm to 1 µm, which contains the wavelength range of visible light.

An extremely thin structure can be obtained in the case where the content of the carbon nanotubes in the precursor coating composition used is lowered (for example, simply diluted to reduce the viscosity), and the coating composition is coated to a thin film form. A thicker structure can be obtained by increasing the content of the carbon nanotubes. Furthermore, a further thicker structure can be obtained by repeatedly coating the coating composition. The extremely thin structure may have a thickness of about 10 nm, and the thicker structure may have such a thickness that has no upper limit by repeatedly coating the coating composition. The thickness obtained by one time coating is about 5 µm. Moreover, a structure in a desired shape can be obtained by injecting the precursor coating composition having the content adjusted into a mold, followed by crosslinking.

In the case where the carbon nanotube structure is produced by the first process, the positions where the carbon nanotubes are crosslinked with each other, i.e., the crosslinked positions where the functional groups in the carbon nanotubes and the crosslinking agent undergo a crosslinking reaction, have such a structure that the residual groups of the functional groups remaining after the crosslinking reaction are connected to each other through a through linking group, which is a residual group of the crosslinking agent remaining after the crosslinking reaction.

As having been described, in the precursor coating composition in this case, the crosslinking agent as one of the constitutional components thereof is preferably non-self-polymerizable. In the case where the crosslinking agent is non-self-polymerizable, the linking group in the carbon nanotube structure finally produced is constituted by only one residual group of the crosslinking agent, and thus the distances among the carbon nanotubes crosslinked can be controlled to the size of the residual group of the crosslinking agent, so as to obtain the intended network structure of the carbon nanotubes with high reproducibility. Furthermore, the crosslinking agent does not intervene multiply, and thus the substantial density of the carbon nanotubes in the carbon nanotube structure can be increased. The distances of the carbon nanotubes can be made in such a state that the carbon nanotubes are extremely close to each other electrically and physically (i.e., the carbon nanotubes are substantially directly in contact with each other) by decreasing the size of the residual group of the crosslinking agent.

In the case where the carbon nanotube structure is produced by using a precursor coating composition containing a sole kind of the functional groups in the carbon nanotubes and a sole kind of the non-self-polymerizable crosslinking agent, the crosslinked parts in the structure have the same crosslinked structure (which is referred to the case 1). In the case where the carbon nanotube structure is produced by using a precursor coating composition containing plural kinds of the functional groups in the carbon nanotubes and/or plural kinds of the non-self-polymerizable crosslinking agents, the crosslinked parts in the structure have, as a major part, the crosslinked structure having the combination of the functional group used and the non-self-polymerizable crosslinking agent used (which is referred to the case 2).

In the case where the carbon nanotube structure is produced by using a precursor coating composition containing the self-polymerizable crosslinking agent, on the other hand, the crosslinked parts where the carbon nanotubes are crosslinked with each other in the carbon nanotube structure have a mixed state containing various kinds of linking groups having different numbers of the crosslinking agents linked (polymerized), and a particular one crosslinked structure cannot constitute a major part, irrespective as to whether the functional groups and the crosslinking agent are of a sole kind or plural kinds.

In other words, the use of the non-self-polymerizable crosslinking agent provides the crosslinked parts among the carbon nanotubes in the carbon nanotube structure are bonded to the functional group through only one residual group of the crosslinking agent, so as to provide mainly the same crosslinked structure. The term "mainly the same crosslinked structure" referred herein means such a concept that includes the case where the crosslinked parts in the structure have, as a major part thereof, the crosslinked structure having the combination of the functional group used and the non-self-polymerizable crosslinking agent used (the case 2), as well as the case where all the crosslinked parts have the same crosslinked structure (the case 1).

In the case of "mainly the same crosslinked structure", the lower limit of the "proportion of the crosslinked structure having the same structure" cannot be determined unconditionally because, for example, such a case can be considered that a functional group or a functional crosslinked structure having a different purpose from the formation of the network structure of the carbon nanotubes are applied to the crosslinked parts. However, in order to realize the higher electric and physical characteristics of the carbon nanotubes through the firm network, the "proportion of the crosslinked structure having the same structure" is preferably 50% or more, more preferably 70% or more, and further preferably 90% or more, in terms of the number of the crosslinked parts, and in the most preferred embodiment, all the crosslinked parts have the same structure. The proportion in terms of number can be obtained by such a method or the like that an intensity ratio of absorption spectra corresponding to the crosslinked structures is measured in an infrared spectrum.

In the case where of a carbon nanotube structure having crosslinked parts where the carbon nanotubes are crosslinked with each other having mainly the same crosslinked structure, the uniform network of carbon nanotubes can be formed in a desired state, whereby the electric and physical characteristics can be obtained uniformly and favorably, and furthermore, with the expected characteristics or with high reproducibility.

The linking group is preferably those having a hydrocarbon as a skeleton. The term "hydrocarbon as a skeleton" herein means that the main chain part of the linking group, which engages in linking the residual groups of the functional groups of the crosslinked carbon nanotubes remaining after the crosslinking reaction, is constituted by a hydrocarbon, and a side chain, which occurs by substituting a hydrogen atom of the main chain part by another substituent, is not considered. It is more preferred that the entire linking group is constituted by a hydrocarbon.

The hydrocarbon preferably has from 2 to 10 carbon atoms, more preferably from 2 to 5 carbon atoms, and further preferably from 2 or 3 carbon atoms. The linking group is not particularly limited, as far as it has two or more valences.

In the crosslinking reaction between the functional group —COOR (wherein R represents a substituted or unsubstituted hydrocarbon group, preferred examples of which are the same as above) and ethylene glycol, which has been exemplified as a preferred combination of the functional group contained in the carbon nanotubes and the crosslinking agent, the crosslinked parts where the plural carbon nanotubes are crosslinked with each other have a structure —COO(CH$_2$)$_2$OCO—.

In the crosslinking reaction between the functional group —COOR (wherein R represents a substituted or unsubstituted hydrocarbon group, preferred examples of which are the same as above) and glycerin, the crosslinked parts where the plural carbon nanotubes are crosslinked with each other have a structure —COOCH$_2$CHOHCH$_2$OCO— or —COOCH$_2$CH(OCO—)CH$_2$OH where two OH groups contribute to the crosslinking reaction, or a structure —COOCH$_2$CH(OCO—)CH$_2$OCO— where three OH groups contribute to the crosslinking reaction.

As having been described, the composite material according to the invention in the case where the carbon nanotube structure is produced by the first process has a carbon nanotube structure having a network structure through plural crosslinked parts where plural carbon nanotubes are crosslinked with each other, and therefore, it can stably exhibit high transmission characteristics of carriers (e.g., electrons and holes), high physical characteristics, such as thermal conduction and toughness, and other characteristics, such as light absorption property, which are peculiar to carbon nanotubes, without the problems occurring in the simple carbon nanotube dispersion film, such as destabilization of contact state and arrangement state of carbon nanotubes.

In the case where the carbon nanotube structure is produced by the second process, the parts where the plural carbon nanotubes are crosslinked with each other, i.e., the crosslinked parts formed by the crosslinking reaction of the functional groups contained in the plural carbon nanotubes, have the crosslinked structure where the residual groups of the functional groups remaining after the crosslinking reaction are connected to each other. In this case, the carbon nanotube structure also contains carbon nanotubes connected to each other through the crosslinked parts in a matrix form, and exhibition of the characteristics peculiar to carbon nanotubes themselves, such as high transmission characteristics of electrons and holes, is facilitated. In other words, the carbon nanotubes structure contains carbon nanotubes closely connected and contains no other binder, and thus it is substantially formed only with carbon nanotubes.

Furthermore, the substantial density of the carbon nanotubes in the carbon nanotube structure can be increased owing to the crosslinked parts formed by directly reacting the functional groups, and the distances among the carbon nanotubes can be reduced to obtain such a state that the carbon nanotubes are extremely close to each other electrically and physically by reducing the size of the functional groups, whereby exhibition of the characteristics of the carbon nanotubes themselves can be further facilitated.

The structure contains mainly the same crosslinked structure owing to the crosslinked parts formed by chemical bond of the functional groups, and therefore, the uniform network of carbon nanotubes can be formed in a desired state, whereby the electric and physical characteristics can be obtained uniformly and favorably, and furthermore, with the expected characteristics or with high reproducibility.

B-2 Employed as n-Type Semiconductor Substance

The production process of the invention that is suitable for forming the carbon nanotube structure employed as the n-type semiconductor substance in the n-type semiconductor layer 21 shown in FIGS. 3 and 4 (hereinafter, sometimes simply referred to as the second production process) contains dropping a mixed liquid containing carbon nanotubes onto a liquid surface of a film forming liquid to spread the carbon nanotubes on the liquid surface of the film forming liquid, so as to form a carbon nanotube thin film, and drawing up a layer containing a p-type semiconductor substance, a part or the whole of which has been immersed in advance in the film forming liquid, from the liquid surface of the film forming liquid to make a surface of the layer containing the p-type semiconductor substance in contact with the carbon nanotube thin film spread on the liquid surface of the film forming liquid, so as to form the carbon nanotube thin film on the surface of the layer containing the p-type semiconductor substrate.

The second production process of the invention requires the dropping step (A) and the drawing up step (C) shown above, and may have between these steps, depending on necessity, (B) a compressing step of compressing the carbon nanotube thin film thus spread on the liquid surface of the film forming liquid in a direction in parallel to the liquid surface.

The second production process of the invention will be described separately.

(A) Dropping Step

The dropping step, which is necessary in the invention, is a step of dropping a mixed liquid containing carbon nanotubes onto a liquid surface of a film forming liquid to spread the carbon nanotubes on the liquid surface.

The mixed liquid may have such a formulation that is capable of spreading the carbon nanotubes on the liquid surface of the film forming liquid upon dropping on the liquid surface. Specific examples of the formulation include a mixed liquid containing carbon nanotubes and an ionic liquid (an ionic liquid-carbon nanotube mixed liquid).

The ionic liquid in the invention means such a liquid that is referred to as an ambient temperature molten salt or simply a molten salt and constituted by an organic cation and an inorganic anion, and is in a liquid state under ordinary temperature and ordinary pressure even though it is constituted only by ions. The ionic liquid is receiving intensive attention since the discovery of such an ionic liquid in 1992 that is stable in the air and is constituted by an organic cation and an inorganic anion. The ionic liquid is excellent in heat stability and chemical stability and has such characteristics as incombustibility and non-volatility. In the invention, the ionic liquid may be selected from those having been known in the art.

Preferred examples of the ionic liquid in the invention include those constituted by a cation represented by one of the following general formulae (1) to (4) (preferably a quaternary ammonium ion) and an anion (X).

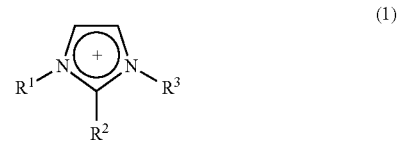

(1)

(2)

-continued $$[NR5_xH4_{-x}]^+ \quad (3)$$

$$[PR6_yH4_{-y}]^+ \quad (4)$$

In the general formula (1), $R^1$ represents an alkyl group having from 1 to 4 carbon atoms or a hydrogen atom, and particularly preferably a methyl group having 1 carbon atom, and $R^2$ represents an alkyl group having from 1 to 4 carbon atom or a hydrogen atom, and particularly preferably a hydrogen atom.

In the general formulae (1) to (4), $R^3$ to $R^6$ each represents an alkyl group having 20 or less carbon atoms or an alkyl group having an ether bond and a total number of carbon and oxygen of 20 or less.

In the general formula (1), it is preferred that $R^1$ and $R^3$ are not the same as each other.

In the general formula (3) and (4), x and y each represents an integer of from 1 to 4.

Examples of the anion (X) as a counter ion of the cation include ions of tetrafluoroboric acid, hexafluorophosphoric acid, bis(trifluoromethylsulfonyl)imidic acid, perchloric acid, tris(trifluoromethylsulfonyl)carbon acid, tri fluoromethanesulfonic acid, dicyanamide, trifluoroacetic acid, an organic carboxylic acid and a halogen.

In the invention, a commercially available ionic liquid, such as an ionic liquid available from Kanto Kagaku Corp., can be used without problems.

The ionic liquid is appropriately selected depending on the kind of the carbon nanotubes used. For example, in the case where the carbon nanotubes used have a hydrophilic functional group, such as —COOH, —NH$_2$, —OH and —CHO, a hydrophilic ionic liquid is preferably combined therewith. In the case where the carbon nanotubes used have no functional group, and the case where the carbon nanotubes used have a hydrophobic functional group, such as —COOR (wherein R represents a hydrocarbon group) and —SiR$_3$ (wherein R represents a hydrocarbon group), on the other hand, a hydrophobic ionic liquid is preferably combined therewith.

Preparation of Ionic Liquid-Carbon Nanotubes Mixed Liquid

The carbon nanotubes and the ionic liquid are mixed to prepare an ionic liquid-carbon nanotubes mixed liquid (hereinafter, sometimes simply referred to as a mixed liquid) used in for producing a carbon nanotube thin film (mixing step).

It is preferred to apply a shearing force upon mixing. In this operation, it has been reported that the ionic liquid is coordinated among each of the carbon nanotubes to bond the carbon nanotubes with a cation-it-electron interaction (as described in JP-A-2004-142972). Accordingly, in the case where an ionic liquid is used as a dispersion medium, each of the carbon nanotubes in the mixed liquid cannot be present completely independently from each other, but bundles of carbon nanotubes are present. The bundles are liable to form in the case where the carbon nanotubes are SWNT and in the case where the carbon nanotubes are MWNT but are thin and flexible.

Specifically, the ionic liquid and the carbon nanotubes are placed in a mortar and well mixed under application of a shearing force by a pestle. A mixed liquid having carbon nanotubes well dispersed in an ionic liquid can be obtained by mixing for about 15 minutes.

The preparation method of the mixed liquid in the invention is not particularly limited, and any method can be employed that can mix and disperse the ionic liquid and the carbon nanotubes to obtain such a state that the carbon nanotubes are well dispersed in the ionic liquid.

The specific proportion of the carbon nanotubes in the mixed liquid cannot be determined unconditionally, and is generally about from 0.001 to 5 g/g, preferably about from 0.005 to 1 g/g, and more preferably about from 0.01 to 0.05 g/g, based on the mass of the ionic liquid.

Dropping and Spreading

The mixed liquid of the ionic liquid and the carbon nanotubes thus obtained is dropped on a liquid surface of a film forming liquid to spread the carbon nanotubes on the liquid surface, whereby a carbon nanotube thin film is formed on the liquid surface.

The film forming liquid (sometimes referred to as a spread liquid or a spread solution) that can be used in the invention is preferably a liquid having a relatively large surface tension, and specifically the surface tension thereof is preferably $5.0 \times 10^{-2}$ N/m or more, and more preferably $6.0 \times 10^{-2}$ N/m or more. The film forming liquid is particularly preferably water and/or glycerin.

The dropping amount of the mixed liquid onto the liquid surface of the film forming liquid is not particularly limited and can be appropriately adjusted corresponding to such factors as the concentration of the carbon nanotubes in the mixed liquid, the kind of the carbon nanotubes used (such as the kind of carbon nanotubes, i.e., SWNT or MWNT, and the presence or absence and the kind of the functional group), the diameter and the length of the carbon nanotubes, and the purity of the carbon nanotubes. The appropriate dropping amount varies depending on the presence or absence of the subsequent compressing step, and therefore, the dropping amount is preferably determined in consideration of the subsequent steps. There is no theoretically absolute dropping amount of the carbon nanotubes because what is to be produced herein is not a monomolecular film (a monomolecular film of carbon nanotubes is practically difficult to produce).

The method of dropping the mixed liquid on the liquid surface of the film forming liquid is not particularly limited, and it is preferred that the mixed liquid is carefully dropped by using, for example, a pipette or a burette to spread the carbon nanotubes contained in the mixed liquid favorably on the liquid surface.

A carbon nanotube thin film can be easily produced on the liquid surface of the film forming liquid only by the operation of the dropping step.

(B) Compressing Step

In the case where a compressing step is carried out subsequent to the dropping step, a carbon nanotube thin film (oriented film) having carbon nanotubes arranged in one direction (oriented) can be obtained. The compressing step in the invention is such a step that the carbon nanotube thin film formed on the liquid surface of the mixed liquid is compressed in a direction in parallel to the liquid surface.

Figure 5:
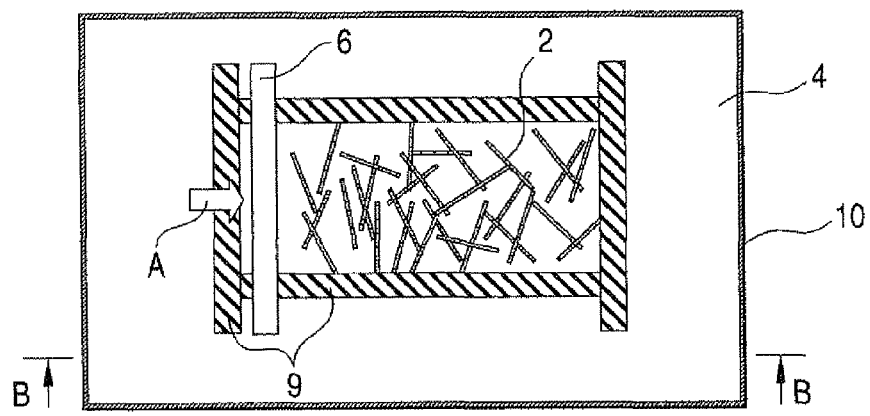
FIG. 5 is a schematic plan view showing an example of an apparatus suitable for carrying out the compressing step in the second production process for a solar cell of the invention.
Figure 6:
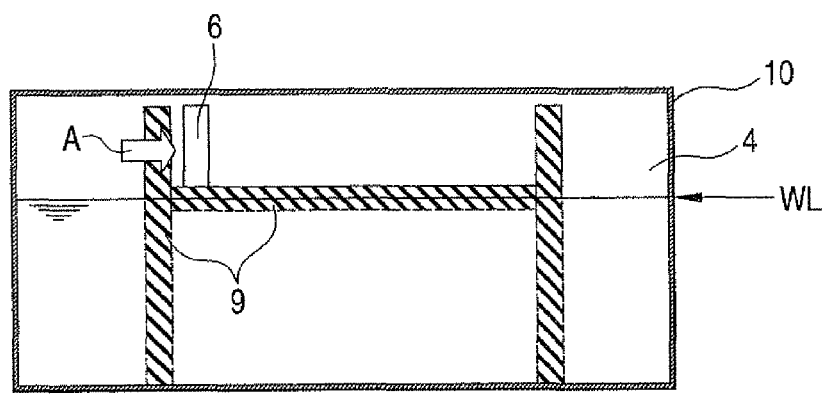
FIG. 6 is a cross sectional view on line B-B in FIG. 5.

FIG. 5 is a schematic plan view showing an example of an apparatus suitable for carrying out the compressing step, and FIG. 6 is a cross sectional view on line B-B in FIG. 5.

In FIGS. 5 and 6, numeral 10 denotes a water bath, in which a film forming liquid 4 is filled to the height of a liquid surface WL. A frame 9 is assembled to compart the liquid surface WL, inside which a float 6 having substantially the same length as the length of one edge of the frame 9 on the liquid surface WL floated on the liquid surface WL. It seems in FIG. 5 that the float 6 is protruded from the frame 9. However, the float 6 has a T-shape as viewed from the arrow A in FIG. 1, and thus the float 6 is fitted inside the frame 9 at the liquid surface WL. The float 6 may not necessarily be floated on the liquid surface WL, but it is sufficient that the float 6 is at least present at the liquid surface WL, and for example, the lower end thereof may be immersed in the film forming liquid 4.

In the apparatus shown in FIGS. 5 and 6, the ionic liquid-carbon nanotubes mixed liquid is dropped on the wide area of the liquid surface WL thus comparted and surrounded by the frame 9 and the float 6 to spread thereon, FIGS. 5 and 6 show the state where the ionic liquid-carbon nanotubes mixed liquid has been dropped and spread, in which numeral 2 schematically denotes the dispersed state of the carbon nanotubes in the ionic liquid-carbon nanotubes mixed liquid.

The thin film of the carbon nanotubes 2 thus spread on the liquid surface WL of the film fanning liquid 4 is then compressed by moving the float 6 to the direction shown in the arrow A (the direction in parallel to the liquid surface) as similar to the ordinary Langmuir-Blodgett method. According to the operation, the carbon nanotubes are arranged substantially in the direction perpendicular to the compressing direction (direction shown by the arrow A).

Figure 7:
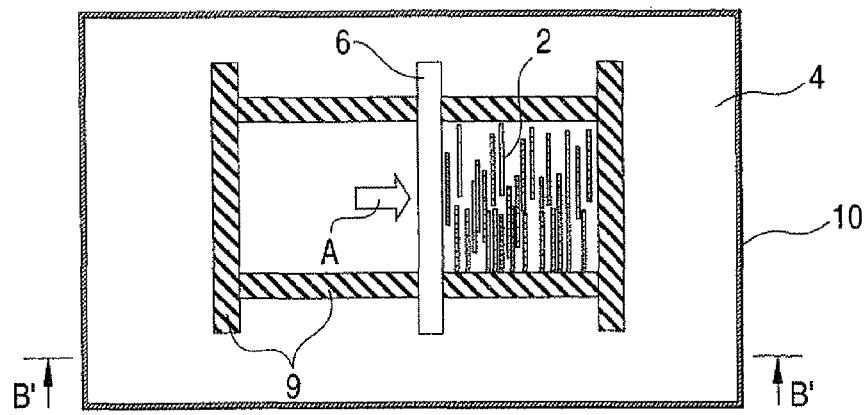
FIG. 7 is a schematic plan view showing the apparatus shown in FIGS. 5 and 6, in which the operation of the compressing step is completed.
Figure 8:
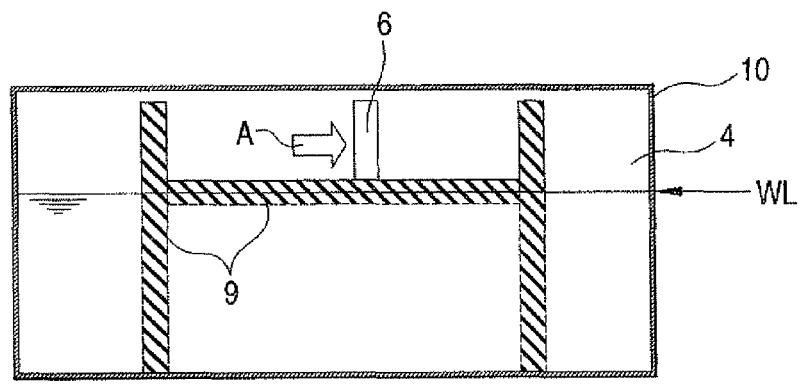
FIG. 8 is a cross sectional view on line B'-B' in FIG. 7.

FIG. 7 is a schematic plan view showing the apparatus shown in FIGS. 5 and 6, in which the operation of the compressing step is completed, and FIG. 8 is a cross sectional view on line IT-if in FIG. 7. The same members and arrow as in FIGS. 5 and 6 are attached with the same numerals and symbols. It is understood that the carbon nanotubes 2 extending in random directions on the liquid surface WL of the film forming liquid 4 as shown in FIG. 5 are arranged in the prescribed direction as shown in FIG. 7 as a result of the operation of the compressing step.

The operation of the compressing step also has such an effect, in addition to the orientation of the carbon nanotubes, that the gaps among the carbon nanotubes can be reduced. A dense carbon nanotube thin film can be obtained by reducing the gaps among the carbon nanotubes.

The compressing ratio in the compressing step (i.e., the ratio $S_1/S_2$, wherein $S_1$ represents an initial area of the liquid surface of the film forming liquid, on which the mixed liquid is to be dropped and spread, and $S_2$ represents an area of the liquid surface after the compressing step) cannot be determined unconditionally because it depends on such factors as the dropped amount of the mixed liquid, the concentration of the carbon nanotubes in the mixed liquid, the kind of the carbon nanotubes used (such as the kind of carbon nanotubes, i.e., SWNT or MWNT, and the presence or absence and the kind of the functional group), the diameter and the length of the carbon nanotubes, and the purity of the carbon nanotubes.

In the case where the compressing ratio is too small, the effects obtained by the compressing step (orientation and densification of the carbon nanotubes) substantially cannot be exerted. In the case where the compressing ratio is too large, on the other hand, there are cases where the layer of the carbon nanotubes is distorted or multiplexed to impair the smoothness of the film. In the later case, however, there is such a possibility that the carbon nanotube thin film can be thickened to develop new applications.

(C) Drawing Up Step

In the state where the dropping step or the compressing step is completed, the carbon nanotube thin film is present on the liquid surface of the film forming liquid. It is necessary to collect the carbon nanotube thin film for using the same. The carbon nanotube thin film is preferably collected by a drawing up step.

In the invention, the drawing up step is an operation effected after completing the dropping step or the compressing step, and is to draw up the carbon nanotube thin film thus spread on the liquid surface of the film forming liquid in such a manner that a part or the whole of the layer of the p-type semiconductor substance is immersed in the film forming liquid in advance, and then the layer of the p-type semiconductor substance drawn up from the liquid surface of the film forming liquid to make the surface of the layer of the p-type semiconductor substance in contact with the carbon nanotube thin film spread on the liquid surface of the film forming liquid, whereby the carbon nanotube thin film is drawn up and formed on the surface of the layer of the p-type semiconductor substrate.

Figure 9:
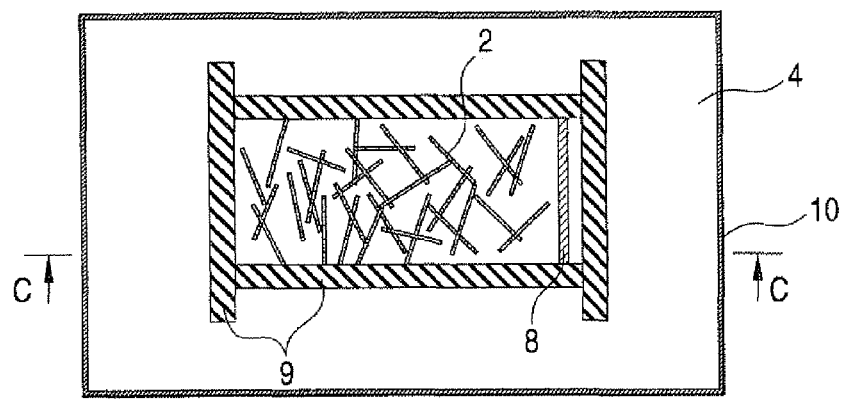
FIG. 9 is a schematic plan view showing a state where a part of a p-type semiconductor layer is immersed in a film forming liquid in advance, onto which an ionic liquid-carbon nanotubes mixed liquid is dropped and spread.

FIG. 9 is a schematic plan view showing a state where a part of a substrate 8 is immersed in the film forming liquid 4 in advance, onto which the ionic liquid-carbon nanotubes mixed liquid is dropped and spread. The same members and arrow as in FIGS. 5 and 6 are attached with the same numerals and symbols. As similar to FIGS. 5 and 7, numeral 2 schematically denotes the dispersed state of the carbon nanotubes in the ionic liquid-carbon nanotubes mixed liquid in FIG. 9.

Figure 10:
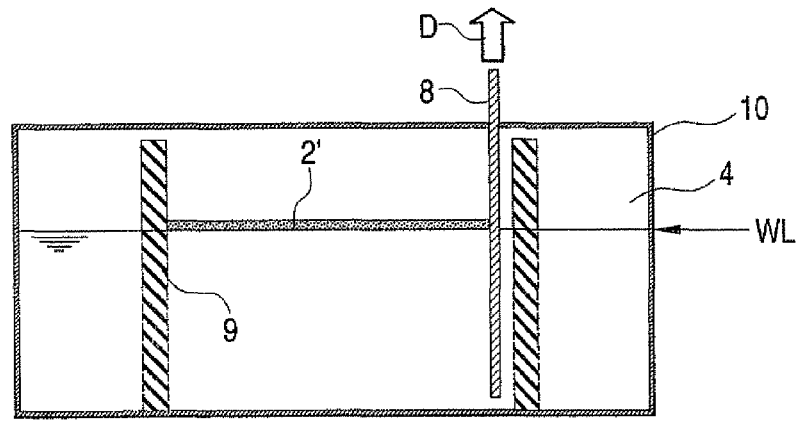
FIG. 10 is a cross sectional view on line C-C in FIG. 9.

FIG. 10 is a cross sectional view on line C-C in FIG. 9 provided that numeral 2' denotes the carbon nanotube thin film spread on the liquid surface WL of the film forming liquid 4.

Figure 11:
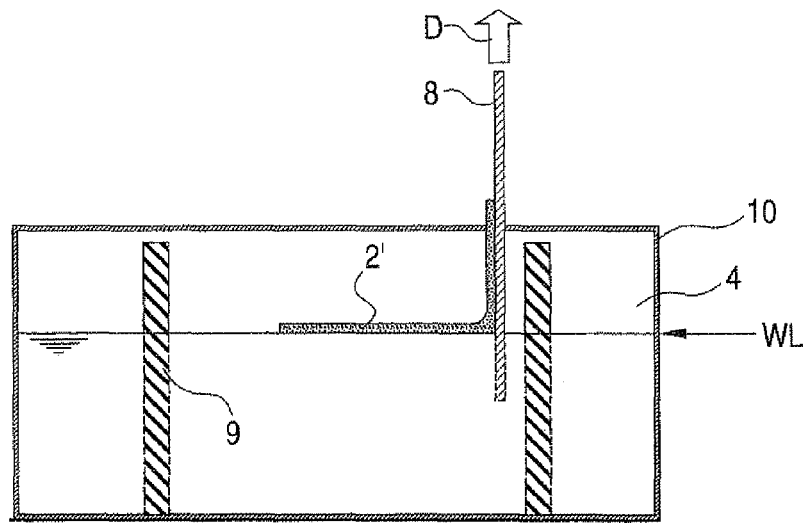
FIG. 11 is a schematic cross sectional view showing the state where the substrate is being withdrawn from the state shown in FIG. 10.

Upon drawing the substrate 8 in the vertical direction (shown by the arrow D) in the state shown in FIG. 10, an edge part of the carbon nanotube thin film 2' is sequentially adhered to the surface of the substrate 8 in contact therewith, whereby the carbon nanotube thin film 2' is transferred to the surface of the substrate 8, as shown in FIG. 11. FIG. 11 is a schematic cross sectional view showing the state where the substrate is being withdrawn from the state shown in FIG. 10.

In the case where the operation of the compressing step is effected before the drawing up step, a carbon nanotube thin film having carbon nanotubes arranged in parallel to each other can be easily formed on a desired surface of a substrate.

Figure 12:
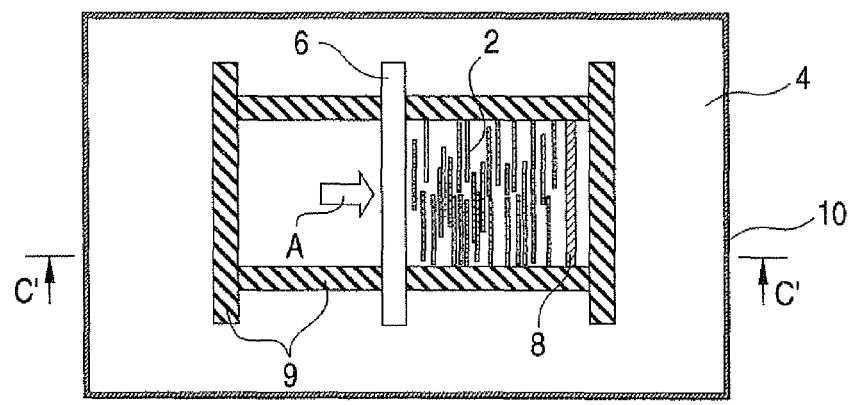
FIG. 12 is a schematic plan view showing a state where a part of a p-type semiconductor layer is immersed in a film forming liquid in advance, and then the dropping step and the compressing step are carried out.

FIG. 12 is a schematic plan view showing a state where a part of the substrate 8 is immersed in the film forming liquid 4 in advance, and then the dropping step and the compressing step are carried out (the same state as in FIG. 7). The same members and arrow as in FIGS. 5 to 10 are attached with the same numerals and symbols. As similar to FIGS. 5, 7 and 9, numeral 2 schematically denotes the dispersed state of the carbon nanotubes in the mixed liquid of the ionic liquid and the carbon nanotubes in FIG. 12.

Figure 13:
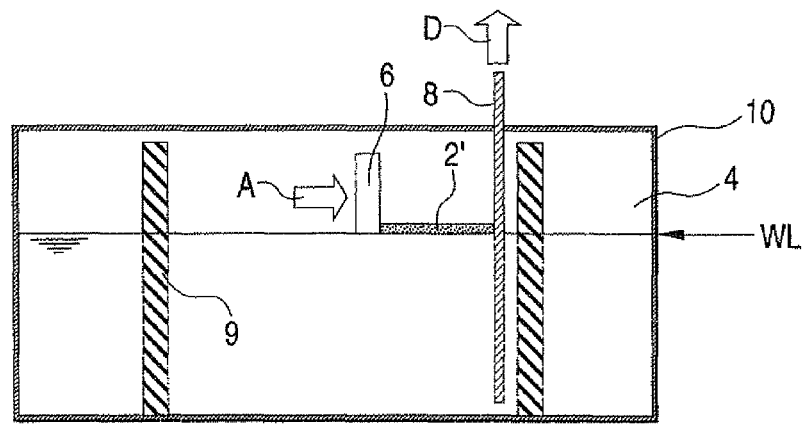
FIG. 13 is a cross sectional view on line C-C in FIG. 12.

FIG. 13 is a cross sectional view on line C'-C' in FIG. 12 provided that numeral 2' denotes the carbon nanotube thin film spread on the liquid surface WL of the film forming liquid 4.

Upon drawing the substrate 8 in the vertical direction (shown by the arrow D) in the state shown in FIG. 9, the carbon nanotube thin film 2' is transferred to the surface of the substrate 8 and easily formed thereon.

While the direction of drawing up the substrate is the vertical direction as in FIGS. 10 and 11, it is not necessarily the vertical direction, and it is sufficient that the substrate is drawn in such a manner that the surface of the substrate is sequentially exposed from the liquid surface, whereby the carbon nanotube thin film spread (and compressed) on the liquid surface is sequentially transferred on the surface of the substrate.

The carbon nanotube thin film thus transferred on the surface of the substrate may be allowed to stand as it is (i.e., so-called air drying), whereby the film forming liquid is evaporated to form a stable layer, and depending on necessity, the thin film may be dried by hot air drying or oven drying.

The carbon nanotube thin film obtained in the invention is extremely smooth and uniform. Such a smooth and uniform carbon nanotube thin film can be obtained by the invention that cannot be attained, for example, by a coated film obtained by coating a surface of a substrate with a simple carbon nanotube dispersion liquid having carbon nanotubes dispersed in a dispersion medium, such as water. According to the invention, furthermore, a carbon nanotube thin film having carbon nanotubes oriented can be easily obtained by adding the compressing step.

In the carbon nanotube structure film produced by the second production process of the invention, the thickness of the film is not particularly limited and may be selected from a wide range of from an extremely thin layer to a thick layer. In consideration of capability of a solar cell, the thickness of the carbon nanotube structure film is preferably selected from the range of from 10 nm to 5 µm, and more preferably selected from the range of from 100 nm to 1 µm, which contains the wavelength range of visible light.

Carbon nanotubes as a raw material generally contain impurities, such as amorphous carbon, which cannot be completely removed even though a purification operation is effected. According to the operation of the compressing step, carbon nanotubes can be proximate to each other up to the limit, but there are cases where the carbon nanotubes cannot be compressed beyond a certain extent even though the compressing ratio is increased, due to inhibition of particles of the impurities present therein. The disincentives of capability exhibition of the carbon nanotube thin film in various purposes reside in the size of the particles of impurities rather than the content thereof.

Therefore, the diameter of the particles of impurities is preferably as small as possible, and specifically it is preferably 500 µm or less, and more preferably 100 µm or less.

As having been described, in the mixed liquid before dropping and spreading, there are cases where the plural carbon nanotubes are bundled to have a certain thickness, and in the case where a carbon nanotube thin film is formed by the second production process of the invention using the mixed liquid in such a state, the resulting carbon nanotube thin film contains carbon nanotubes in such a state that they are bundled with each other.

An ionic liquid has good affinity with the film forming liquid, such as water, and even in the case where a hydrophobic ionic liquid is used in the mixed liquid, the ionic liquid gradually or rapidly runs into the film forming liquid from the mixed liquid upon dropping the mixed liquid in the dropping step, whereby carbon nanotubes mainly remain on the liquid surface. However, in the case where the carbon nanotubes are allowed to stand on the liquid surface for a too long period of time, the carbon nanotubes are transferred into the film forming liquid by dragging by the ionic liquid. Therefore, the carbon nanotube thin film is preferably drawn up at an appropriate timing by continuously probing the state of the thin film.

The solar cell and the process for producing the same according to the invention have been described with reference to the aforementioned embodiments, but the invention is not limited to the embodiments.

The invention and the advantages thereof will be described in more detail below with reference examples and comparative examples, but the invention is not construed as being limited to the examples.

EXAMPLE 1

A solar cell of a pin junction having a constitution shown in FIG. 2 is produced by using a carbon nanotube structure as a p-type semiconductor substance.

Production of Carbon Nanotube Structure Film

A carbon nanotube structure film is produced in the following manner.

30 mg of single wall carbon nanotube powder (purity: 90%, average diameter 1.1 nm, length: 0.5 to 100 produced by Sigma Aldrich, Inc.) is added to 20 mL of concentrated nitric acid (60% by mass aqueous solution, produced by Kanto Kagaku Co., Ltd.), and the mixture is refluxed at 120° C. for 1.5 hours to synthesize carbon nanotube carboxylic acid.

The temperature of the solution is lowered to room temperature, and the solution is subjected to centrifugal separation at 5,000 rpm for 15 minutes to separate a precipitate from a supernatant fluid. The precipitate thus recovered is dispersed in 10 mL of pure water and then again subjected to centrifugal separation at 5,000 rpm for 15 minutes to separate a precipitate from a supernatant fluid (thus, a washing operation has been completed once). The washing operation is repeated in further 5 times, and a precipitate is then finally recovered.

The precipitate thus recovered is measured for infrared absorption spectrum. For comparison, the single wall carbon nanotubes as the starting material are also measured for infrared absorption spectrum. The comparison of the spectra reveals that an absorption peak at 1,735 $cm^{-1}$, which is characteristic of carboxylic acid, is observed in the spectrum of the precipitate, but is not observed in the spectrum of the single wall carbon nanotube starting material. It is understood therefrom that carboxyl groups are introduced into the carbon nanotubes through the reaction with nitric acid. That is, it has been confirmed that the precipitate is carbon nanotube carboxylic acid.

It has been confirmed that the precipitate thus recovered is good in dispersibility by adding it in neutral pure water: The result supports the infrared absorption spectrum indicating that hydrophilic carboxyl groups are introduced into the carbon nanotubes.

30 mg of the carbon nanotube carboxylic acid thus prepared in the aforementioned step is added to 25 mL of methanol (produced by Wako Pure Chemical Industries, Ltd.), to which 5 mL of concentrated sulfuric acid (98% by mass, produced by Wako Pure Chemical Industries, Ltd.) is then added. The mixture is refluxed at 65° C. for 6 hours to attain methyl-esterification. The precipitate is washed with water and then recovered, The precipitate thus recovered is measured for infrared absorption spectrum. As a result, absorption peaks at 1,735 $cm^{-1}$ and in a range of from 1,000 to 1,300 $cm^{-1}$, which are characteristic of an ester, are observed in the spectrum, and thus it is confirmed that the carbon nanotube carboxylic acid is esterified. 30 mg of the methyl-esterified carbon nanotube carboxylic acid obtained in the aforementioned step is added to 4 g of glycerin (produced by Kanto Kagaku Co., Ltd.) and mixed by using an ultrasonic dispersing machine. The mixture is then added to 4 g of methanol as a viscosity adjusting agent to prepare a precursor coating composition.

An n-type silicon (n-Si) substrate (thickness: 625 µm, thermal oxidation film of 10 nm, 8 to 12 Ωcm, mirror finished, dimension: 10 mm×15 mm) is used as an n-type semiconductor layer 11. On an area of 5 mm square at one end of the substrate, titanium is vapor-deposited to 10 nm and then gold is vapor-deposited to 100 nm to form an electrode 12.

About 20 µL of the aforementioned precursor coating composition is coated on the surface of the n-type silicon substrate to an area of 5 mm×10 mm and then heated to 200° C. in the air to cure the film by crosslinking the carbon nanotubes. A p-type semiconductor layer 13 containing a carbon nanotube structure is thus formed on the surface of the n-type silicon substrate through an intermediate layer (i layer) of a thermal oxidation film. The p-type semiconductor layer 13 thus formed has a thickness of about 500 nm. According to the operation, a pin junction shown in FIG. 2 is formed.

An electrode 14 is formed on the p-type semiconductor layer 13 by using a silver paste while preventing it from a short circuit with the n-type silicon substrate (n-type semiconductor layer 11).

Thus, a solar cell of Example 1 is produced.

Figure 14:
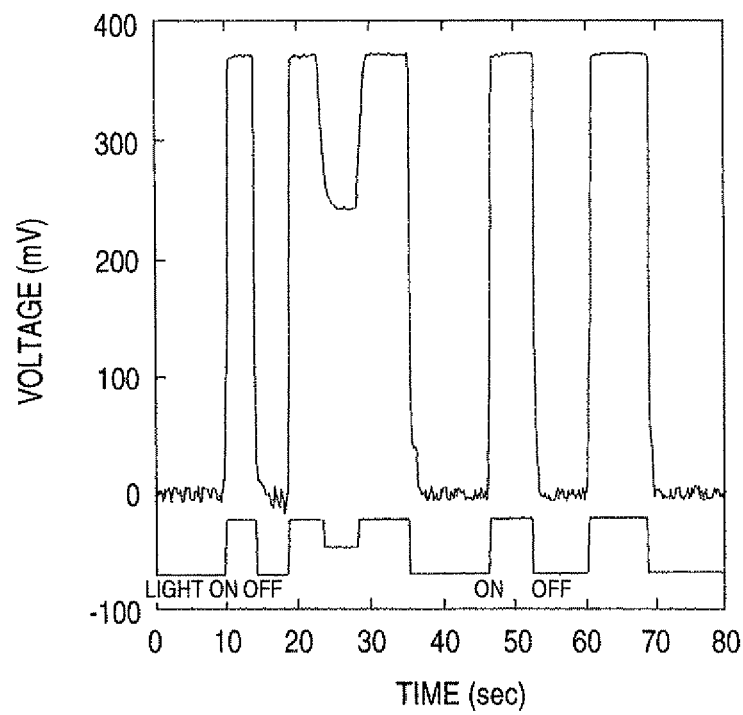
FIG. 14 is a graph showing results of measurement for response to light in the solar cell of Example 1.

The resulting solar cell is measured for voltage and electric current in response to light (light response test). A halogen lamp (Lumina Ace, produced by Hayashi Watch Works, Co., Ltd.) is used as a light source, and a digital multimeter (Model 2000, produced by Keithley Instruments, Inc.) is used for monitoring the electric current and voltage. It is found that the solar cell of this example shows a release voltage of 380 mV upon irradiating with the halogen lamp (incident light: about 9.5 mW/cm$^2$). FIG. 14 shows the results of the test. The graph shown in FIG. 14 indicates results of measurement for release voltage formed between the electrodes 12 and 14 in chronological order upon turning on and off the halogen lamp. In the period within the time of about from 25 to 30 second, the measurement is carried out with the output of the halogen lamp reduced to about half.

The solar cell produced in Example 1 is subjected to an electric power generation test under the following conditions. The solar cell is connected to a resistor of from 1 to 1M Ω and irradiated with light using the aforementioned light source (incident light: about 11 mW/cm$^2$), The electric current and the voltage obtained thereon are measured by using a digital multimeter (Model 2000, produced by Keithley Instruments, Inc.).

Figure 15:
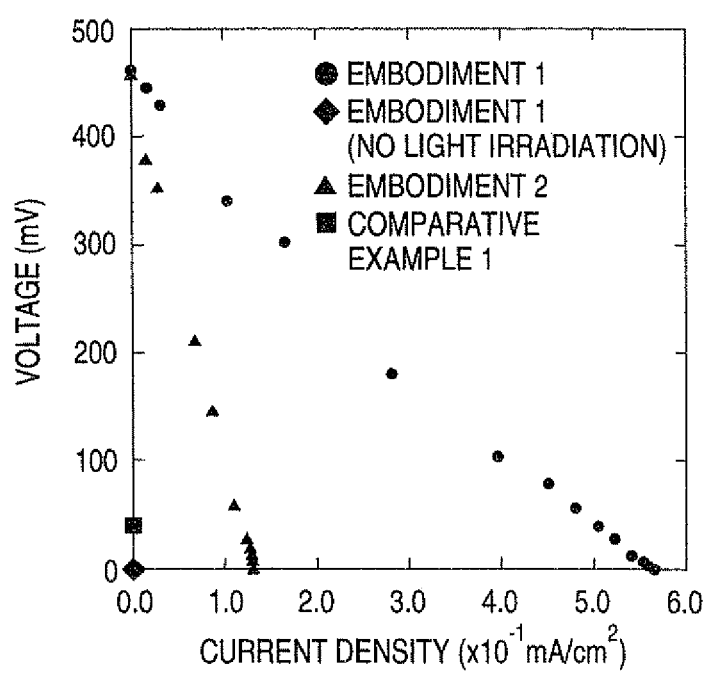
FIG. 15 is a graph showing electric current-voltage characteristics of the solar cells of Examples 1 and 2 and Comparative Example 1.

The resulting electric current-voltage characteristics are shown in FIG. 15. It is confirmed from the graph shown in FIG. 15 that the solar cell of this example has a release voltage of 460 mV and a maximum output of 0.5 mW/cm$^2$ (at an electromotive voltage of 181 mV and an electric current of 0.28 mA/cm$^2$). It is understood from the results that the solar cell of this example attains electric power generation.

For confirmation, the same test as the aforementioned electric power generation test is carried out after placing the solar cell of this example in a dark room without irradiating with light of the light source. The resulting electric current-voltage characteristics are shown in FIG. 15. It is confirmed from the graph shown in FIG. 15 that the solar cell of this example generates substantially no electric power without light irradiation. Comparative Example 1

On the same n-type silicon substrate as in Example 1, electrodes corresponding to the electrodes 12 and 14 without forming a carbon nanotube structure film to obtain a solar cell of Comparative Example 1.

An electric power generation test is carried out under the same conditions as in Example 1. The results obtained are shown in FIG. 15. It is confirmed from the graph shown in FIG. 15 that no electric current flows, and electric power generation is not attained, although a release voltage of 40 mV is formed.

EXAMPLE 2

A solar cell of a pn junction having a constitution shown in FIG. 1 is produced by using a carbon nanotube structure as a p-type semiconductor substance.

On the same n-type silicon (n-Si) substrate (thickness: 625 μm, thermal oxidation film of 10 nm, 8 to 12 Ωcm, mirror finished, dimension: 10 mm×15 mm) as in Example 1, an electrode 12 (dimension: 5 mm square, 10 nm of titanium and 100 nm of gold) is formed in the same manner as in Example 1. In order to form a pn junction, the substrate is immersed in buffered hydrofluoric acid (HF: 20% by volume, NH$_4$F: 21% by volume, H2O: 57% by volume) for 60 seconds to remove a thermal oxidation film on the surface of the n-type silicon substrate.

About 20 μL of a precursor coating composition containing SWNT each having a functional group, which is prepared in the same manner as in Example 1, is coated on the surface of the n-type silicon substrate having no thermal oxidation film to an area of 5 mm×10 mm and then heated to 200° C. in the air to cure the film by crosslinking the carbon nanotubes. A p-type semiconductor layer 13 containing a carbon nanotube structure is thus formed directly on the surface of the n-type silicon substrate. The p-type semiconductor layer 13 thus formed has a thickness of about 500 nm. According to the operation, a pin junction shown in FIG. 1 is formed.

An electrode 14 is formed on the p-type semiconductor layer 13 by using a silver paste while preventing it from a short circuit with the n-type silicon substrate (n-type semiconductor layer 11).

Thus, a solar cell of Example 2 is produced.

An electric power generation test is carried out under the same conditions as in Example 1. The results obtained are shown in FIG. 15. It is confirmed from the graph shown in FIG. 15 that the solar cell of this example has a release voltage of 460 mV and a maximum output of 0.014 mW/cm$^2$ (at an electromotive voltage of 212 mV and an electric current of 0.07 mA/cm$^2$). It is understood from the results that the solar cell of a pn junction attains electric power generation although the electric current is decreased in comparison to the solar cell of a pin junction.

EXAMPLES 3 TO 8 AND COMPARATIVE EXAMPLES 2 and 3

Solar cells are obtained by forming a carbon nanotube structure film having a crosslinked structure of single wall carbon nanotubes (SWNT), a carbon nanotube structure film formed as a film by the Langmuir-Blodgett (LB) method by using SWNT or a carbon nanotube structure film obtained by producing in the same manner as in Example 1 except that the single wall carbon nanotubes (SWNT) are replaced by multi-wall carbon nanotubes (MWNT), on an n-type silicon (n-Si) substrate, a p-type silicon (p-Si) substrate, an n-type gallium arsenic (n-GaAs) substrate, an n-type indium antimony (n-InSb) substrate or an n-type indium arsenic (n-InAs) substrate, in the combinations shown in Table 3 below in the same manner as in Example 1.

TABLE 3

| Carbon nanotube structure film | Semiconductor layer (substrate) combined with carbon nanotube structure film | | | | |
|---|---|---|---|---|---|
| | n-Si | p-Si | n-GaAs | n-InSb | n-InAs |
| SWNT crosslinked film | Example 3 | — | Example 6 | Example 7 | Example 8 |
| SWNT LB film | Comparative Example 2 | Example 4 | — | — | — |
| MWNT crosslinked film | Comparative Example 3 | Example 5 | — | — | — |

The specific conditions of these examples and comparative examples are as follows. Those conditions that are not specifically mentioned are the same as in Example 1.

Production of Carbon Nanotube Structure Film having Crosslinked Structure Film of SWNT The same structure film as in Example 1 is used.
Production of Dispersed Carbon Nanotube Structure Film as LB Film Single wall carbon nanotubes (SWNT, which are the carbon nanotubes after purification in Example 1) are dispersed in an ionic liquid (1-butyl-3-methylimidazolium hexafluorophosphate) to a concentration of 1% by mass to obtain a mixed liquid.

An apparatus shown in FIGS. 9 and 10 is prepared, in which pure water as a film forming liquid 4 is housed. The mixed liquid is dropped on the liquid surface of pure water to spread an SWNT thin film on the liquid surface of pure water, which is then scooped up by drawing up a substrate (denoted by numeral 8 in the figure) (see FIG. 11). Thereafter, the substrate is heated to about 100° C. for 5 minutes. The aforementioned operations including the dropping, spreading and heating operations are repeated in 10 times to form a carbon nanotube structure LB film. The carbon nanotube structure LB film thus formed as an n-type semiconductor film has a thickness of about 400 nm.
Production of Carbon Nanotube Structure Film having Crosslinked Structure Film of MWNT A carbon nanotube structure film is produced basically in the same manner as in Example 1 except that the single wall carbon nanotubes used in Example 1 are replaced by multi-layer carbon nanotubes (purity: 95%, average diameter: 8 nm, length: 0.1 to 200 μm, produced by Sigma Aldrich, Inc.). The other differences in conditions are as follows.

The reflux time for synthesizing carbon nanotube carboxylic acid is prolonged as compared to that in the case using single wall carbon nanotubes. Specifically, 30 mg of the multi-wall carbon nanotubes are added to 20 mL of concentrated nitric acid (60% by mass aqueous solution, produced by Kanto Kagaku Co., Ltd.), and the mixture is refluxed at 120° C. for 20 hours to synthesize carbon nanotube carboxylic acid.

n-Type Silicon (n-Si) Substrate

The same substrate as in Example 1 is used.

p-Type Silicon (p-Si) Substrate

A p-type silicon substrate (thickness: 625 μm, thermal oxidation film of 10 nm, 14 to 20 Ωcm, mirror finished, dimension: 10 mm×15 mm) is used.

n-Type Gallium Arsenic (n-GaAs) Substrate

An n-type gallium arsenic substrate (thickness: 500 μm, spontaneous oxidation film of about 2 nm, $1.1 \times 10^{-3}$ to $3.2 \times 10^{-3}$ Ωcm, mirror finished, dimension: 10 mm×15 mm) is used.

n-Type Indium Antimony (n-InSb) Substrate

An n-type indium antimony substrate (thickness: 450 μm, spontaneous oxidation film of about 2 nm, 30 to 40 Ωcm, mirror finished, dimension: 10 mm×15 mm) is used.

n-Type Indium Arsenic (n-InAs) Substrate

An n-type indium arsenic substrate (thickness: 450 μm, spontaneous oxidation film of about 2 nm, 10 to 20 Ωcm, mirror finished, dimension: 10 mm×15 mm) is used.

The resulting solar cells are measured for voltage and electric current in response to light. The measurement is carried out in the same manner and conditions as in the light response test in Example 1 except that the light amount (incident energy) of the halogen lamp for irradiation is about 15 mW/cm$^2$, which is larger than that in Examples 1 and 2.

As a result of hole measurement, the carrier type of the carbon nanotube structure film having an SWNT crosslinked structure shows p-type semiconductor characteristics, and that of the carbon nanotube structure film of an SWNT LB film shows n-type semiconductor characteristics. The carrier type of the carbon nanotube structure film having an MWNT crosslinked structure is not known since the hole measurement therefor is not carried out, but it is expected reversely that the structure film has n-type semiconductor characteristics from the measurement results of the electric current response described later. The results are shown in Table 4 below.

TABLE 4

| | Carbon nanotube structure film | Semiconductor layer combined | Release voltage |
|---|---|---|---|
| Example 3 | SWNT crosslinked structure | n-Si | +500 mV |
| Example 4 | SWNT LB film | p-Si | +50 mV |
| Example 5 | MWNT crosslinked structure | p-Si | +250 mV |
| Example 6 | SWNT crosslinked structure | n-GaAs | +500 mV |
| Example 7 | SWNT crosslinked structure | n-InSb | +1 mV |
| Example 8 | SWNT crosslinked structure | n-InAs | +1 mV |
| Comparative Example 2 | SWNT LB film | n-Si | not respond |
| Comparative Example 3 | MWNT crosslinked structure | n-Si | −10 mV |

It is understood from the results in Table 4 that the solar cell of Example 3 produced by forming an SWNT crosslinked film exhibiting p-type semiconductor characteristics on an n-Si substrate shows an electromotive force (release voltage) of about +500 mV. The solar cell of Comparative Example 2 produced by forming an SWNT LB film exhibiting n-type semiconductor characteristics on n-Si substrate does not respond to light, and the solar cell of Example 4 produced by forming the same film on a p-Si substrate shows an electromotive force of about +50 mV. It is considered that the reason why the electromotive forces of the crosslinked film and the LB film are greatly different from each other resides in the difference of the nature of the films. The solar cell of Example 3 has the same structure as in Example 1 but shows a larger release voltage than Example 1, i.e., an electromotive force of about +500 mV, owing to larger energy of incident light than that in Example 1.

The solar cell of Comparative Example 3 produced by forming an MWNT crosslinked film on an n-Si substrate shows an electromotive force of −10 mV, and the solar cell of Example 5 produced by the same film on a p-Si substrate shows an electromotive force of +250 mV. It is expected from the results that the MWNT crosslinked film in the example shows n-type semiconductor characteristics.

It is understood from the results of Examples 6 to 8 that in the case where the SWNT crosslinked film is combined with semiconductor substrates (GaAs, InSb and InAs) exhibiting n-type semiconductor characteristics other than silicon, the solar cells show electromotive force in response to light although they vary in electromotive force.

According to the constitution of the invention, easiness in production and freedom in shape, which are advantages of a solar cell using an organic semiconductor, can be enjoyed. Furthermore, owing to considerably good electroconductivity as the characteristics of carbon nanotubes, improvement in carrier transporting property can be expected as compared to the case using an ordinary organic semiconductor. Moreover, there is such a possibility that light of a wide wavelength range from a shorter wavelength to a longer wavelength can be utilized owing to the black color of carbon nanotubes.

The term "electrically connected" referred herein means that the structure film totally has electroconductivity sufficient for achieving semiconductor characteristics, irrespective to whether or not the carbon nanotubes are physically in contact with each other.

The decision as to whether the structure film, in which plural carbon nanotubes are dispersed in an electrically connected state, (hereinafter, sometimes simply referred to as a carbon nanotube structure film) is employed as a p-type semiconductor substance or an n-type semiconductor substance may be appropriately made depending on the purposes and a semiconductor substance used as the counterpart. The constitution of the carbon nanotube structure film varies depending on whether the carbon nanotube structure film is employed as a p-type semiconductor substance or an n-type semiconductor substance. In other words, the nature of the semiconductor layer, i.e., a p-type or an n-type, is determined by the constitution of the structure film.

In the case where the structure film is employed as a p-type semiconductor substance, the p-type semiconductor substance contains the carbon nanotube structure film containing plural carbon nanotubes each having a functional group bonded thereto, and the carbon nanotubes are crosslinked to each other through chemical bonds with the functional groups to form a network structure.

In the case where the carbon nanotube structure film is employed as a p-type semiconductor substance, the structure film constitutes a carbon nanotube film, in which plural carbon nanotubes form a network structure through plural crosslinked parts. Accordingly, a pn interface in the pn junction or a pi interface in the pin junction can have a substantially large area, and the carbon nanotubes are stably connected to each other through crosslinking, whereby the electroconductivity can be prevented from being unstable, which may cause a problem in the case where the carbon nanotubes are only in contact with each other for obtaining electroconductivity.

In this case, it is preferred that the solar cell has a layer containing the n-type semiconductor substance having thereon a layer containing the p-type semiconductor substance, and the layer containing the p-type semiconductor substance is formed by coating and curing a coating composition containing a precursor of the carbon nanotube structure film on the layer containing the n-type semiconductor substance to form the pn junction or the pin junction between the layers. According to the constitution, the precursor coating composition can be directly coated and cured on the surface of the layer containing the n-type semiconductor substance. In other words, a pn junction or a pin junction can be conveniently formed without an ordinary inorganic semiconductor forming process used. The coating composition can be coated on any type of an n-type semiconductor owing to the nature of the coating composition, whereby a pn junction or a pin junction can be formed without limitation in shape.

In the case where the structure film is employed as an n-type semiconductor substance, it is preferred that the n-type semiconductor substance contains a carbon nanotube structure film containing plural carbon nanotubes dispersed therein.

In the solar cell of the invention, it is also preferred that the carbon nanotubes are single wall carbon nanotubes, which have semiconductor characteristics by themselves.

According to the aforementioned process for producing a solar cell of the invention, the solution (which has the same meaning as the aforementioned precursor coating composition in the solar cell of the invention) can be directly coated and cured on the surface of the layer containing the n-type semiconductor substance. In other words, a pn junction or a pin junction can be conveniently formed without an ordinary inorganic semiconductor forming process used. The solution can be coated on any type of an n-type semiconductor owing to the nature of the solution, whereby a pn junction or a pin junction can be formed without limitation in shape.

The solution may contain a crosslinking agent for crosslinking the plural functional groups. In this case, the crosslinking agent is preferably a non-self-polymerizable crosslinking agent, In the case where a non-self-polymerizable crosslinking agent is used, the distance between the carbon nanotubes can be controlled by the size of the residual group of the crosslinking agent used, whereby an intended carbon nanotube network structure (i.e., a carbon nanotube structure) can be obtained with high reproducibility. Furthermore, in the case where the size of the residual group of the crosslinking agent is reduced, the distance between the carbon nanotubes can be reduced to obtain such a state that the carbon nanotubes are extremely closed to each other in electrically and physically means, and the carbon nanotubes in the structure can be densely structuralized.

The reaction for forming the chemical bonds may be a reaction for chemically bonding the plural functional groups.

According to the invention, such a solar cell of a pn junction type or a pin junction type utilizing carbon nanotubes can be provided that is easily produced, has a high photoelectric conversion efficiency, and has less limitation in shape.

According to the solar cell or the process for producing the same of the invention, a solar cell can be produced by a coating operation, whereby the production process can be considerably simplified, whereby the production cost can be reduced, and a solar cell having a large area can be produced. Owing to the use of the carbon nanotubes in a network form as a semiconductor layer, light incident thereon can easily reach the junction interface. The carbon nanotubes have high electroconductivity by themselves, whereby a transparent electrode, which is necessary in the ordinary structure, can be omitted to avoid attenuation due to the transparent electrode, and the production process can be simplified and reduced in cost by omitting the transparent electrode. Furthermore, the carbon nanotubes have black color to have sensitivity in a wide range of wavelength, whereby the wide wavelength range of the incident light can be effectively utilized to provide such a solar cell that is considerably excellent in utilization efficiency of light.

The entire disclosure of Japanese Patent Application No. 2005-048551 filed on Feb. 24, 2005 including specification, claims, drawings and abstract is incorporated herein by reference in its entirety.

What is claimed is:
1. A solar cell comprising:
a layer containing an n-type semiconductor substance;
a first electrode provided on an end portion of a surface of the layer containing the n-type semiconductor substance;
a carbon nanotube structure film provided on the layer containing the n-type semiconductor substance without being in contact with the first electrode and having plural carbon nanotubes; and
a second electrode provided on the carbon nanotube structure film,
wherein the plural carbon nanotubes each have a functional group bonded thereto,
the carbon nanotube structure film has a network structure formed by crosslinking between the plural carbon nanotubes through chemical bond with functional groups had by the plural carbon nanotubes, respectively, and p-type semiconductor characteristics attributed to the network structure of the plural carbon nanotubes, and a pn junction or a pin junction between the n-type semiconductor substance of the layer containing the n-type semiconductor substance and the carbon nanotube structure film is formed.

2. The solar cell according to claim 1, wherein the plural carbon nanotubes are single wall carbon nanotubes.

* * * * *